US012740374B2

(12) United States Patent
Liu et al.

(10) Patent No.: US 12,740,374 B2
(45) Date of Patent: Sep. 15, 2026

(54) METHOD OF OPERATION OF SEMICONDUCTOR PROCESSING TOOL

(71) Applicant: Taiwan Semiconductor Manufacturing Company, Ltd., Hsinchu (TW)

(72) Inventors: Yan-Chun Liu, Taichung City (TW); Yii-Chi Lin, Taipei City (TW); Shahaji B. More, Hsinchu City (TW); Chih-Yu Ma, Hsinchu City (TW); Sheng-Jang Liu, Hsinchu County (TW); Shih-Chieh Chang, Taipei City (TW); Ching-Lun Lai, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 11 days.

(21) Appl. No.: 18/783,485

(22) Filed: Jul. 25, 2024

(65) Prior Publication Data

US 2024/0379398 A1 Nov. 14, 2024

Related U.S. Application Data

(62) Division of application No. 17/647,526, filed on Jan. 10, 2022.

(Continued)

(51) Int. Cl.

| | |
|---|---|
| ***H01L 21/68*** | (2006.01) |
| ***C23C 16/02*** | (2006.01) |
| ***C23C 16/52*** | (2006.01) |
| ***H01L 21/687*** | (2006.01) |
| ***H10P 72/50*** | (2026.01) |
| ***H10P 72/76*** | (2026.01) |

(52) U.S. Cl.

CPC .......... *H10P 72/53* (2026.01); *C23C 16/0209* (2013.01); *C23C 16/52* (2013.01); *H10P 72/7618* (2026.01)

(58) Field of Classification Search

CPC ...... H10P 72/53; H10P 72/50; H10P 72/7618; H10P 72/76; H10P 72/0602; H10P 72/00; H10P 72/0606; C23C 16/0209; C23C 16/02; C23C 16/52; C23C 16/45557; C23C 16/279; C23C 16/4583; C23C 16/458

See application file for complete search history.

(56) References Cited

U.S. PATENT DOCUMENTS

| | | | |
|---|---|---|---|
| 5,125,791 | A | 6/1992 | Volovich |
| 5,540,821 | A | 7/1996 | Tepman |

(Continued)

FOREIGN PATENT DOCUMENTS

| | | | |
|---|---|---|---|
| EP | 3905311 | A1 | 11/2021 |

*Primary Examiner* — Nikolay K Yushin
(74) *Attorney, Agent, or Firm* — Harrity & Harrity, LLP

(57) ABSTRACT

In some implementations, a control device may determine a spacing measurement in a first dimension between a wafer on a susceptor and a pre-heat ring of a semiconductor processing tool and/or a gapping measurement in a second dimension between the wafer and the pre-heat ring, using one or more images captured in situ during a process by at least one optical sensor. Accordingly, the control device may generate a command based on a setting associated with the process being performed by the semiconductor processing tool and the spacing measurement and/or the gapping measurement. The control device may provide the command to at least one motor to move the susceptor.

20 Claims, 24 Drawing Sheets

Related U.S. Application Data

(60) Provisional application No. 63/263,902, filed on Nov. 11, 2021.

(56) References Cited

U.S. PATENT DOCUMENTS

| | | | |
|---|---|---|---|
| 5,793,904 | A | 8/1998 | Clapp et al. |
| 6,032,083 | A | 2/2000 | Oosawa |
| 6,054,784 | A | 4/2000 | Sperling et al. |
| 6,710,286 | B2 | 3/2004 | Han |
| 6,852,988 | B2 | 2/2005 | Li |
| 7,252,738 | B2 | 8/2007 | Tong et al. |
| 8,726,837 | B2 | 5/2014 | Patalay et al. |
| 9,250,196 | B2 | 2/2016 | Okabe et al. |
| 10,522,370 | B2 | 12/2019 | Park et al. |
| 10,903,099 | B2 | 1/2021 | Nakamura et al. |
| 2003/0133372 | A1 | 7/2003 | Fasen et al. |
| 2003/0227624 | A1 | 12/2003 | Wu et al. |
| 2004/0258514 | A1 | 12/2004 | Raaijmakers |
| 2005/0264777 | A1 | 12/2005 | Gardner et al. |
| 2007/0020082 | A1 | 1/2007 | Caveney et al. |
| 2013/0325179 | A1 | 12/2013 | Liao et al. |
| 2016/0215396 | A1 | 7/2016 | Khandelwal et al. |
| 2016/0355927 | A1 | 12/2016 | Weaver et al. |
| 2017/0347461 | A1 | 11/2017 | Zwiers et al. |
| 2018/0311764 | A1 | 11/2018 | Kim et al. |
| 2019/0244842 | A1 | 8/2019 | Ravid et al. |
| 2020/0156183 | A1 | 5/2020 | Pass |
| 2023/0143537 | A1 | 5/2023 | Liu et al. |
| 2023/0178398 | A1 | 6/2023 | Stettner et al. |

200

300

300

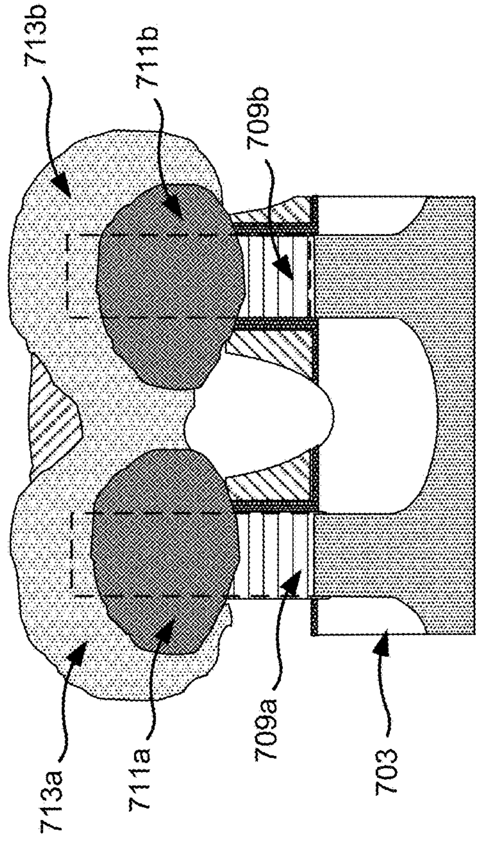
FIG. 7E

METHOD OF OPERATION OF SEMICONDUCTOR PROCESSING TOOL

CROSS-REFERENCE TO RELATED APPLICATION

This application is a divisional of U.S. patent application Ser. No. 17/647,526, filed on Jan. 10, 2022, and entitled "SEMICONDUCTOR PROCESSING TOOL AND METHOD OF OPERATION," which claims priority to U.S. Provisional Patent Application No. 63/263,902, filed on Nov. 11, 2021, and entitled "SEMICONDUCTOR PROCESSING TOOL AND METHOD OF OPERATION," the contents of which are incorporated herein by reference in their entireties.

BACKGROUND

Semiconductor structures, such as sources, drains, and gates, are often deposited using chemical vapor deposition (CVD) or other similar deposition processes. Accordingly, the structures may be formed by growing a film on the surface of a semiconductor wafer. In order to perform CVD, the wafer is generally mounted on a susceptor. The film is deposited on the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7E are diagrams of an example semiconductor structure described herein formed using the semiconductor processing tool of FIG. 1.

DETAILED DESCRIPTION

Figure 1:
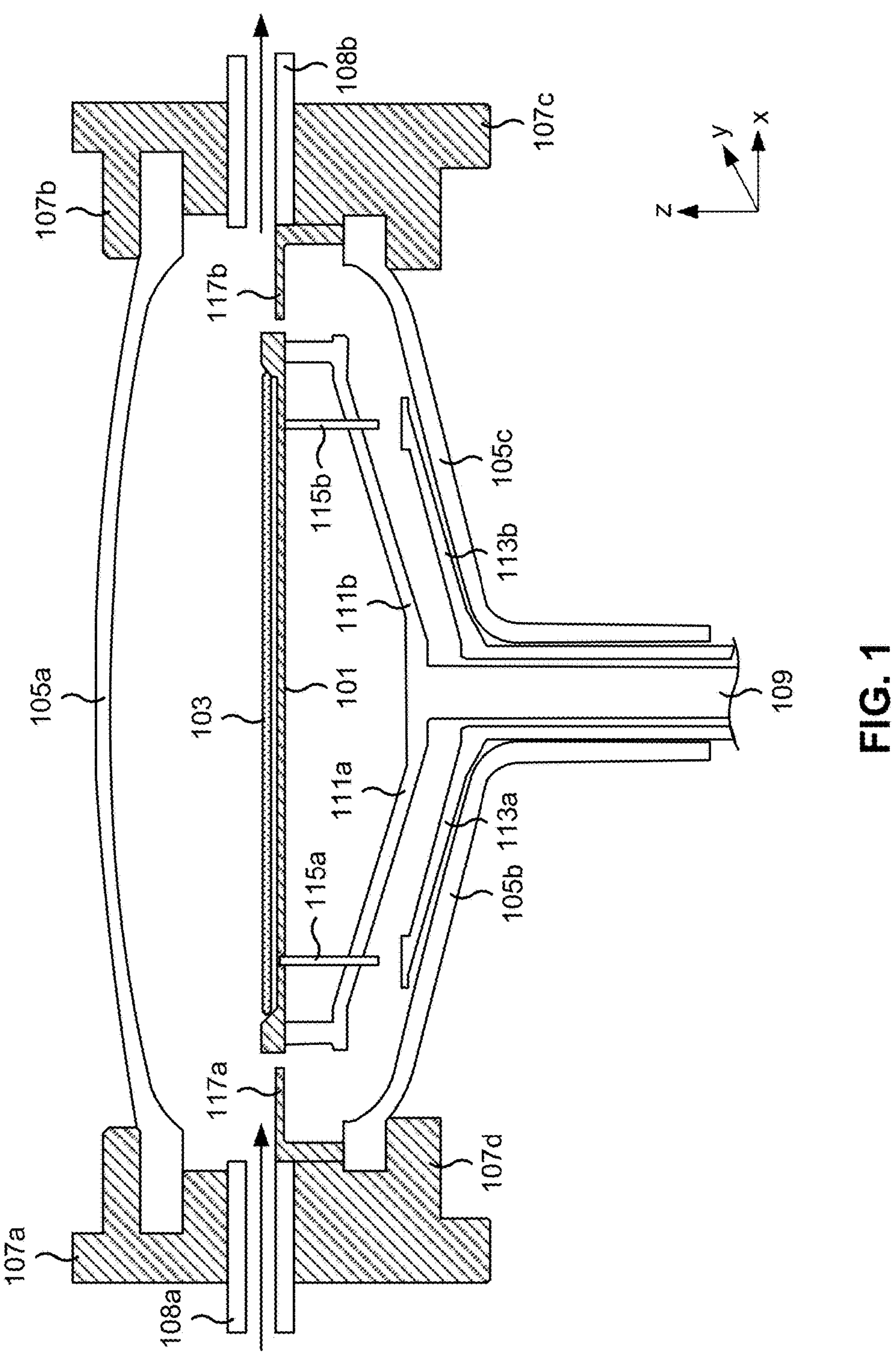
FIG. 1 is a diagram of an example semiconductor processing tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a susceptor is surrounded by a pre-heat ring that warms a wafer on the susceptor in advance of providing a gas including precursor materials. The pre-heat ring also helps maintain a temperature of the wafer during the deposition process. Maintaining the temperature of the wafer helps ensure that sources and drains are deposited to consistent thicknesses on the wafer and that gates are deposited to a desired critical dimension (CD) on the wafer, both of which depend on the temperature of the wafer.

The temperature profile of the wafer depends on a gapping between the susceptor and the pre-heat ring (e.g., along a z-dimension) as well as a spacing between the susceptor and the pre-heat ring (e.g., within an x-y plane). Generally, the gapping and the spacing are adjusted using an iterative process of test deposition, adjustment, another test deposition, another adjustment, and so on. This process is long and wastes manufacturing materials. The process also can cause contamination of wafers because the vacuum is disturbed during each adjustment such that impurities may be introduced into the susceptor environment. Finally, this process is not dynamic and is therefore limited to a particular temperature and flow of the gas. Other deposition processes that use different temperatures and/or gas flows will depend on a new adjustment process for the susceptor.

Some implementations described herein provide techniques and apparatuses for dynamically adjusting gapping and/or spacing of a susceptor relative to a pre-heat ring in situ. For example, a detector, such as a laser or a camera (e.g., a charge-coupled device (CCD) camera), may be configured to measure the gapping and/or the spacing during a process performed by a semiconductor processing tool including the susceptor. Accordingly, a control system instructs a motor to adjust a position of the susceptor based on the measured gapping and the measured spacing. For example, the control system may be programmed with a desired gapping and a desired spacing for a current deposition process such that the control system iteratively instructs the motor to adjust the susceptor until the measured gapping and the measured spacing are within a threshold of the desired gapping and the desired spacing, respectively. As a result, the susceptor is adjusted more quickly and accurately than using the prior iterative process. Additionally, the susceptor is adjusted without disturbing the vacuum within the susceptor environment, which decreases a chance of impurities entering the environment and spoiling deposition processes. Fewer spoiled deposition processes result in less production time that is lost and fewer materials that are wasted.

Additionally, in some implementations, the control system is programmed with a series of deposition processes such that the detector instructs the motor to perform adjustments between each process. For example, an epitaxial structure may be formed successively without removing the epitaxial structure from the susceptor between deposition processes. As a result, production time is reduced. Additionally, the susceptor is adjusted between deposition processes without disturbing the vacuum, which decreases a chance of impurities entering the environment and spoiling later deposition processes, and without moving the wafer, which decreases a chance of the wafer being scratched or otherwise damaged during movement. Fewer spoiled deposition processes and fewer damaged wafers result in less production time that is lost and fewer materials that are wasted.

FIG. 1 is a diagram of an example semiconductor processing tool 100 described herein. In particular, FIG. 1 illustrates a susceptor system for triggering and controlling epitaxial growth on a wafer. Accordingly, the semiconductor processing tool 100 may be referred to as an epitaxial growth tool, device, or apparatus.

As shown in FIG. 1, a susceptor 101 supports a wafer 103 during a chemical vapor deposition (CVD) process or other similar deposition process. The susceptor 101 may be formed of metal, plastic, and/or another hard material that supports the wafer 103. As further shown in FIG. 1, the susceptor 101 may have a shape that is at least partially concave relative to an axis parallel to the susceptor 101. Accordingly, the susceptor 101 may support the wafer 103 on one or more sides as well as from below.

The susceptor 101 may be located within a susceptor environment that is at least a partial vacuum. Accordingly, as shown in FIG. 1, a dome including dome portions 105*a*, 105*b*, and 105*c* may form a chamber in which the susceptor 101 is located and in which at least a partial vacuum is maintained. Dome portions 105*a*, 105*b*, and 105*c* may each be formed of metal, plastic, and/or another hard material that can support the chamber against external pressure caused by the partial vacuum.

Additionally with the dome formed by dome portions 105*a*, 105*b*, and 105*c*, a sidewall including sidewall portions 107*a*, 107*b*, 107*c*, and 107*d* supports the partial vacuum within the chamber. Sidewall portions 107*a*, 107*b*, 107*c*, and 107*d* may each be formed of metal, plastic, and/or another hard material that can support the chamber against external pressure caused by the partial vacuum. As further shown in FIG. 1, a passage 108*a* is formed between the sidewall portion 107*a* and the sidewall portion 107*d* to function as a reactive gas supply passage (also referred to as a supply passage). Vapor including precursor materials that are deposited via epitaxial growth may therefore enter the chamber through the passage 108*a* during a processing step performed on the wafer 103 (such as a CVD process). Similarly, a passage 108*b* is formed between the sidewall portion 107*b* and the sidewall portion 107*c* to function as a gas exhaust passage (also referred to as an exhaust passage). After flowing over the wafer 103 to cause epitaxial growth, the vapor may exit the chamber through the passage 108*b*.

As further shown in FIG. 1, a column 109 (also referred to as a shaft) supports the susceptor 101 from below. The column 109 may be formed of metal, plastic, and/or another hard material that can support the susceptor 101. In some implementations, and as shown in FIG. 1, the column 109 includes a plurality of arms, such as arms 111*a* and 111*b*. Because FIG. 1 shows a cross-section of the semiconductor processing tool 100, the column 109 may include one or more arms along a direction perpendicular to FIG. 1 and thus not shown. Using additional arms distributes weight of the susceptor 101 and the wafer 103 over more arms, which reduces stress to each arm and increases an expected lifespan of each arm. Using fewer arms conserves materials and time used to build the semiconductor processing tool 100.

In order to load the wafer 103 on the susceptor 101 and unload the wafer 103 from the susceptor 101, the semiconductor processing tool 100 may include a lifting mechanism (also referred to as a substrate lift portion) that includes a plurality of arms, such as arms 113*a* and 113*b*. In some implementations, the lifting mechanism may, similar to column 109, include a central support for the plurality of arms. As an alternative, each arm 113*a* and 113*b* may be attached to a separate support, as shown in FIG. 1. Because FIG. 1 shows a cross-section of the semiconductor processing tool 100, the semiconductor processing tool 100 may include one or more arms of the lifting mechanism along a direction perpendicular to FIG. 1 and thus not shown.

As further shown in FIG. 1, the susceptor 101 may include one or more holes for one or more lift pins, such as lift pins 115*a* and 115*b*. Each lift pin 115*a* and 115*b* may be formed of metal, plastic, and/or another hard material such that the lift pins can be used to raise and lower wafer 103, as described in greater detail below. Because FIG. 1 shows a cross-section of the semiconductor processing tool 100, the semiconductor processing tool 100 may include one or more lift pins along a direction perpendicular to FIG. 1 and thus not shown. In some implementations, each lift pin 115*a* and 115*b* is wider at a top portion than at a bottom portion such that the lift pin can move up and down through a corresponding hole in the susceptor 101 but without falling through the hole.

The wafer 103 may be moved up and down using lift pins 115*a* and 115*b*. For example, the column 109 may move downward and/or the arms 113*a* and 113*b* may move upward in order to push lift pins 115*a* and 115*b* through the holes in the susceptor 101. Accordingly, the lift pins 115*a* and 115*b* may contact an underside of wafer 103 and lift the wafer 103 off the susceptor 101. Similarly, the column 109 may move upward and/or the arms 113*a* and 113*b* may move downward such that gravity pulls lift pins 115*a* and 115*b* through the holes in the susceptor 101. Accordingly, the lift pins 115*a* and 115*b* may lower the wafer 103 on the susceptor 101 and stop contacting the underside of wafer 103.

Using additional lift pins and corresponding arms provides more stability to the wafer 103 during raising and lowering, which reduces chances of the wafer 103 slipping on the lift pins or falling off (which would result in a wasted wafer). It also distributes weight of the susceptor 101 and the wafer 103 over more arms, which reduces stress to each arm and increases an expected lifespan of each arm. Using fewer lift pins and corresponding arms reduces a quantity of contact points with the lift pins, which reduces chances of damaging the wafer 103 from scratching the underside with the lift pins (which would result in a wasted wafer). It also conserves materials and time used to build the semiconductor processing tool 100.

The processing step performed on the wafer 103 (such as a CVD process step) may also use heat to trigger and control epitaxial growth on the wafer 103. Accordingly, a pre-heat ring formed by portions 117*a* and 117*b* may generate heat (e.g., using an electric current or other form of convection) to maintain a temperature of the wafer 103 during the processing step. Although shown as including one pre-heat ring, the semiconductor processing tool 100 may include a plurality of pre-heat rings around the susceptor 101 (e.g., as described in connection with FIGS. 2A and 2B). Using additional pre-heat rings can maintain a higher temperature of the wafer 103, which can reduce an amount of time needed for the processing step. Using fewer pre-heat rings conserves power during the processing step as well as materials and time used to build the semiconductor processing tool 100.

The number and arrangement of components shown in FIG. 1 are provided as an example. The semiconductor processing tool 100 may include additional components, fewer components, different components, or differently arranged components than those shown in FIG. 1. Additionally, or alternatively, a set of components (e.g., one or more components) of the semiconductor processing tool 100 may perform one or more functions described as being performed by another set of components of the semiconductor processing tool 100.

Figure 2A:
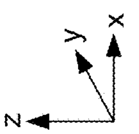
FIGS. 2A and 2B are diagrams of an example pre-heat ring component described herein for use in the semiconductor processing tool of FIG. 1.
Figure 2A:
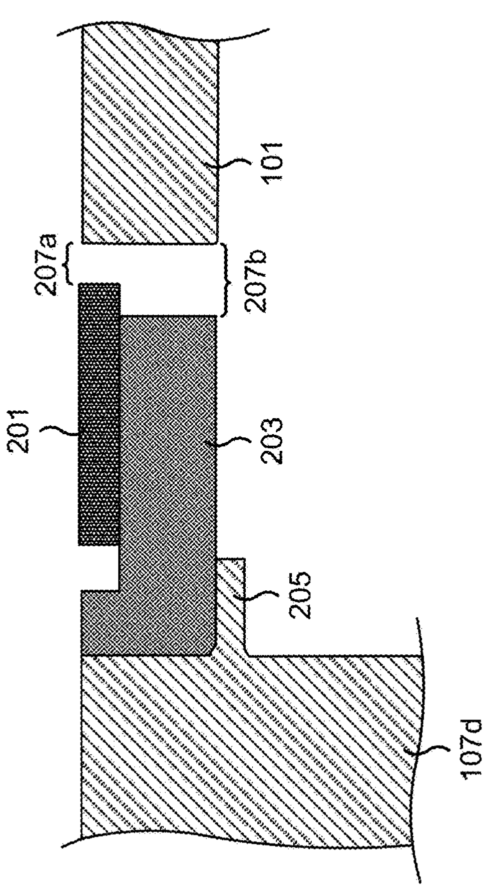

FIG. 2A is a diagram of example implementation 200 associated with a semiconductor processing tool. Example implementation 200 may be included in the semiconductor processing tool 100 of FIG. 1.

As shown in FIG. 2A, a susceptor 101 may be surrounded by a pre-heat ring that includes a plurality of components. For example, the pre-heat ring may include a first ring 201 on a second ring 203. The second ring 203 may include a same material as the first ring 201. Accordingly, in some implementations, the second ring 203 uses an electric current or other form of convection, in tandem with the first ring 201, to maintain a temperature of the wafer 103, higher than if the first ring 201 were used alone. As an alternative, the second ring 203 may include an insulating material. Accordingly, in some implementations, the second ring 203 reduces heat lost from the first ring 201 to the sidewall portion 107*d*, which conserves power during performance of a processing step.

Additionally, in some implementations, the sidewall portion 107*d* may include a flange 205 (also referred to as a stepped portion). The flange 205 may include an insulating material. Accordingly, in some implementations, the flange 205 reduces heat lost from the second ring 203 to the sidewall portion 107*d*, which conserves power during performance of a processing step.

As further shown in FIG. 2A, the susceptor 101 may be associated with a spacing 207*a* in a first dimension (e.g., a dimension along an x-y plane) between a top surface of the susceptor 101 and a top surface of the pre-heat ring (e.g., the first ring 201). Additionally, the susceptor 101 may be associated with a spacing 207*b* in the first dimension between a bottom surface of the susceptor 101 and a bottom surface of the pre-heat ring (e.g., the second ring 203).

In some implementations, the spacings 207*a* and 207*b* may be equal. As an alternative, when the susceptor 101 is angled relative to a second dimension (perpendicular to the first dimension, such as along a z axis), the spacings 207*a* and 207*b* may be different. Additionally, or alternatively, when the pre-heat ring is not linear along the second dimension (e.g., because the pre-heat ring includes a plurality of components, such as the first ring 201 and the second ring 203), the spacings 207*a* and 207*b* may be different. Accordingly, the "spacing" at a point on the susceptor 101 may refer to an average or other combination of spacings 207*a* and 207*b* or may refer to a selected one of spacings 207*a* and 207*b* (such as a larger of the spacings, a smaller of the spacings, always spacing 207*a*, or always spacing 207*b*).

In some implementations, the top surface of the susceptor 101 and the top surface of the pre-heat ring may be located at different points along the second dimension. Accordingly, the "spacing" may refer to a projection of the vector from one of the top surfaces to the other of the top surfaces along an axis associated with the first dimension (e.g., a projection onto the x-y plane). Similarly, the bottom surface of the susceptor 101 and the bottom surface of the pre-heat ring may be located at different points along the second dimension. Accordingly, the "spacing" may refer to a projection of the vector from one of the bottom surfaces to the other of the bottom surfaces along an axis associated with the first dimension (e.g., a projection onto the x-y plane).

Figure 2B:
Figure 2B:
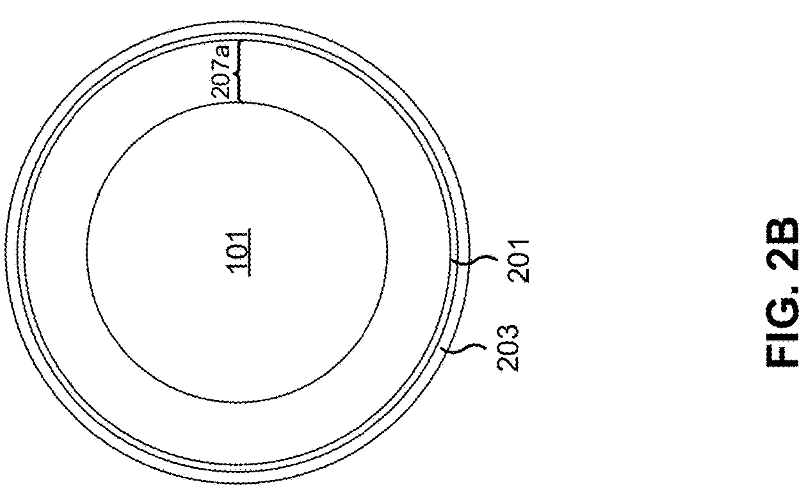

FIG. 2B is a different view of example implementation 200 associated with a semiconductor processing tool. FIG. 2B shows the spacing 207*a* from a top-down view of susceptor 101 relative to the pre-heat ring that includes the first ring 201 and the second ring 203.

The number and arrangement of components shown in FIGS. 2A and 2B are provided as an example. The implementation may include additional components, fewer components, different components, or differently arranged components than those shown in FIGS. 2A and 2B. Additionally, or alternatively, a set of components (e.g., one or more components) of FIGS. 2A and 2B may perform one or more functions described as being performed by another set of components of FIGS. 2A and 2B.

Figure 3:
FIGS. 3 and 4 are diagrams of example spacing and gapping measurements described herein associated with the semiconductor processing tool of FIG. 1.
Figure 3:
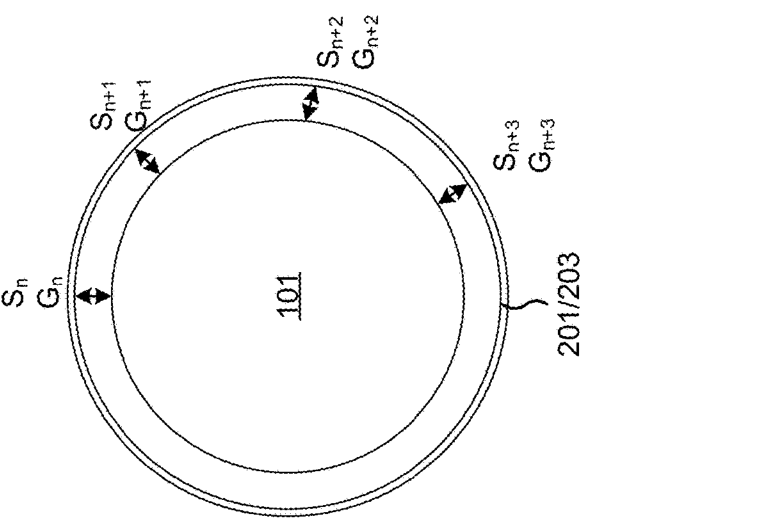

FIG. 3 is a diagram of example implementation 300 associated with a semiconductor processing tool. Example implementation 300 may be included in the semiconductor processing tool 100 of FIG. 1.

As shown in FIG. 3, the susceptor 101 may be associated with a plurality of spacings associated with a first dimension (e.g., a dimension along an x-y plane) between the susceptor 101 and the pre-heat ring (e.g., the first ring 201 and the second ring 203). For example, as shown in FIG. 3, the plurality of spacings may be represented by $S_n$, $S_{n+1}$, $S_{n+2}$, $S_{n+3}$, and so on. Each spacing may be associated with a different point on a circumference of the susceptor 101. Accordingly, "spacing" may refer to an individual spacing at one point on the susceptor 101 (e.g., one of $S_n$, $S_{n+1}$, $S_{n+2}$, or $S_{n+3}$) or to an average or other combination of two or more spacings at different points on the susceptor 101.

Similarly, the susceptor 101 may be associated with a plurality of gappings associated with a second dimension (e.g., a dimension along a z axis) between the susceptor 101 and the pre-heat ring (e.g., the first ring 201 and the second ring 203). For example, as described in connection with FIG. 4, each gapping may be between a top surface of the susceptor 101 and a top surface of the pre-heat ring (e.g., the first ring 201 and the second ring 203). As shown in FIG. 3, the plurality of gappings may be represented by $G_n$, $G_{n+1}$, $G_{n+2}$, $G_{n+3}$, and so on. Accordingly, "gapping" may refer to an individual gapping at one point on the susceptor 101 (e.g., one of $G_n$, $G_{n+1}$, $G_{n+2}$, or $G_{n+3}$) or to an average or other combination of two or more gappings at different points on the susceptor 101.

The number and arrangement of components shown in FIG. 3 are provided as an example. The implementation may include additional components, fewer components, different components, or differently arranged components than those shown in FIG. 3. Additionally, or alternatively, a set of components (e.g., one or more components) of FIG. 3 may perform one or more functions described as being performed by another set of components of FIG. 3.

Figure 4:
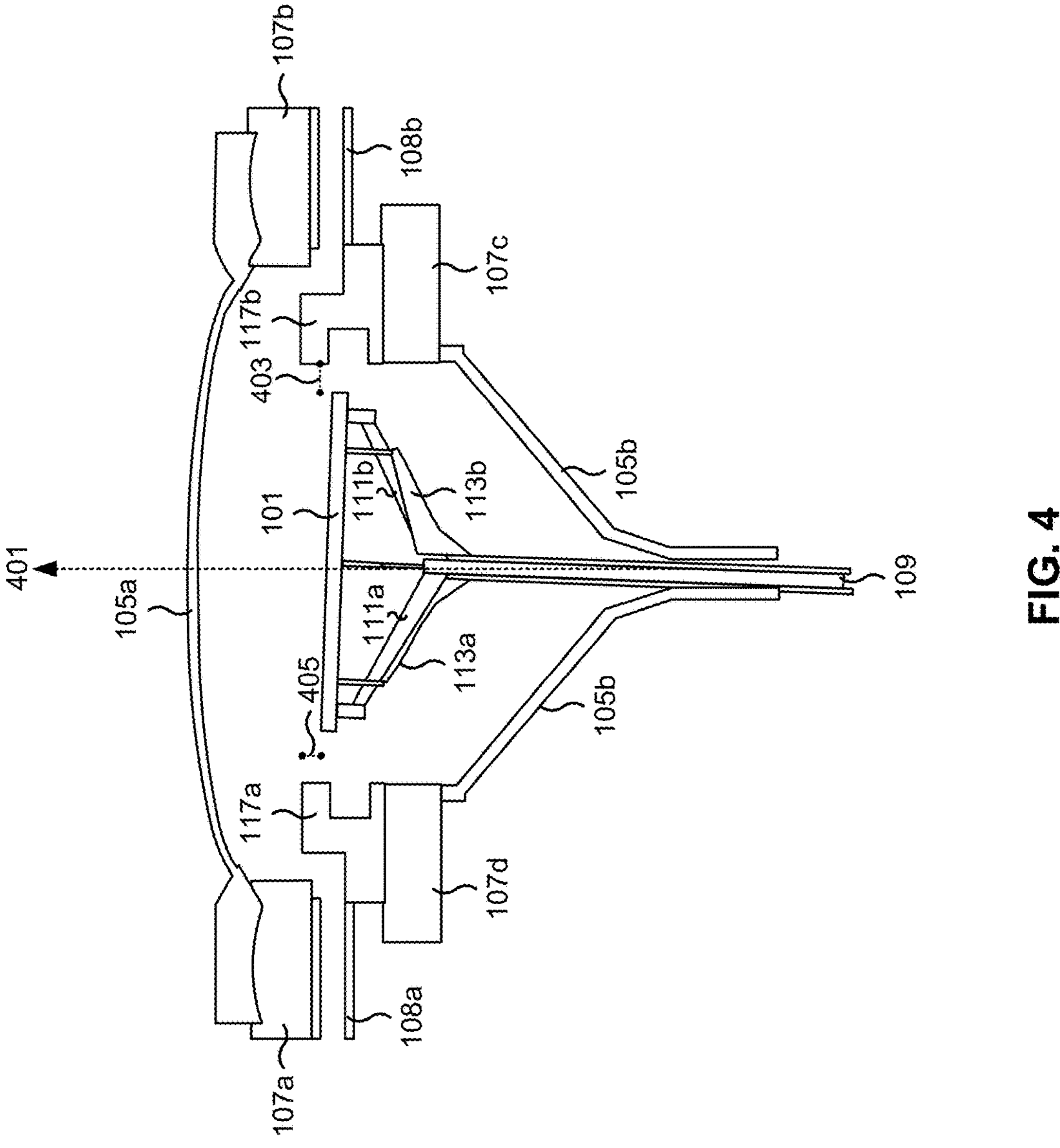

FIG. 4 is a diagram of an example semiconductor processing tool 400 described herein. Example semiconductor processing tool 400 is similar to the semiconductor processing tool 100 of FIG. 1, but the susceptor 101 is angled relative to an axis 401 (such as a z axis).

Accordingly, as shown in FIG. 4, the susceptor 101 is associated with a spacing 403 between the susceptor 101 and the pre-heat ring 117*b*. The spacing 403 may be as described in connection with FIGS. 2A and 2B. In some implementations, the susceptor 101 may be associated with a plurality of spacings, as described in connection with FIG. 3, and/or the spacing 403 may be determined using the plurality spacings.

Additionally, as shown in FIG. 4, the susceptor 101 is associated with a gapping 405 between the susceptor 101 and the pre-heat ring 117*a*. The "gapping" at a point on the susceptor 101 may refer to a distance in a second dimension (e.g., a dimension along a z axis) between a top surface of the susceptor 101 and a top surface of the pre-heat ring 117*a*, a distance in the second dimension between a bottom surface of the susceptor 101 and a bottom surface of the pre-heat ring 117*a*, an average or other combination of these distances, or a selection from these distances (such as a larger of the distances or a smaller of the distances).

The number and arrangement of components shown in FIG. 4 are provided as an example. The semiconductor processing tool 400 may include additional components, fewer components, different components, or differently arranged components than those shown in FIG. 4. Additionally, or alternatively, a set of components (e.g., one or more components) of the semiconductor processing tool 400 may perform one or more functions described as being performed by another set of components of the semiconductor processing tool 400.

FIGS. 5A-5D are diagrams of an example implementation 500 associated with adjusting spacing and/or gapping of a susceptor in a semiconductor processing tool (e.g., an epitaxial growth tool). Example implementation 500 may use the semiconductor processing tool 100 of FIG. 1, which includes a susceptor 101, dome portions 105*a*, 105*b*, and 105*c*, sidewall portions 107*a*, 107*b*, 107*c*, and 107*d*, passages 108*a* and 108*b*, support 109 with arms 111*a* and 111*b*, and a lifting mechanism with arms 113*a* and 113*b*. These components are described in more detail in connection with FIGS. 1-4. Example implementation 500 further includes at least one optical sensor 501 (e.g., a camera or other optical sensor), motors 503*a* and 503*b*, and controller 505. These components are described in more detail below and/or in connection with FIG. 8.

Figure 5A:
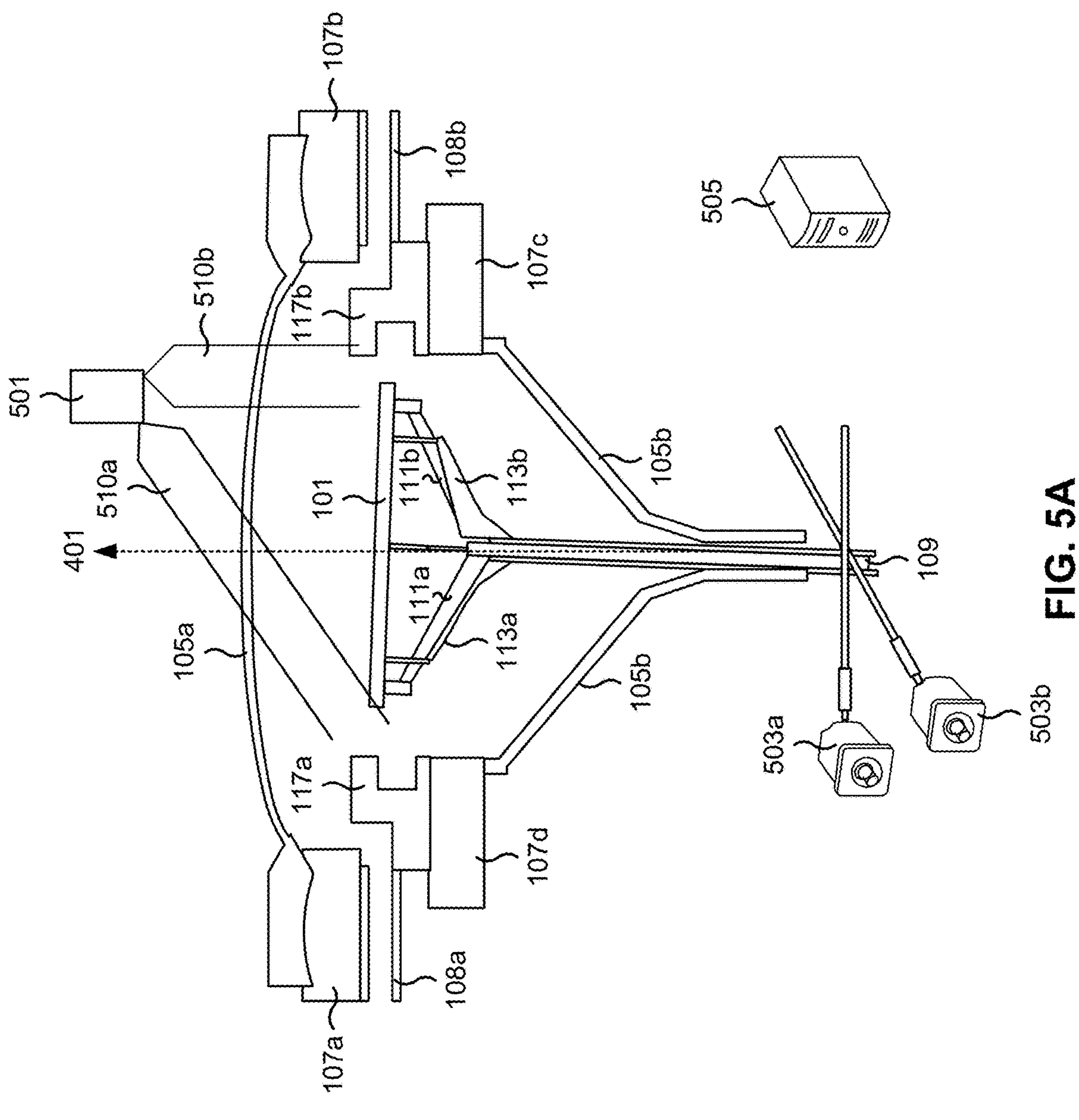
FIGS. 5A-5D are diagrams of an example implementation described herein.

As shown in FIG. 5A, the at least one optical sensor 501 may capture one or more images associated with the susceptor 101. In some implementations, the at least one optical sensor 501 captures images associated with a plurality of views of the susceptor 101, such as views 510*a* and 510*b*. The at least one optical sensor 501 may include different groups of pixels that capture views 510*a* and 510*b* simultaneously. As an alternative, the at least one optical sensor 501 may capture views 510*a* and 510*b* sequentially. Using more views increases an accuracy of spacings and gappings determined from the images (e.g., as described in greater detail below). Using fewer views conserves power and processing resources of the at least one optical sensor 501 and/or the controller 505.

Although implementation 500 is depicted with a single optical sensor 501, other implementations may include additional optical sensors. For example, using a second optical sensor to capture view 510*a* can reduce processing resources used to determine spacing and gapping from the corresponding image because the view 510*a* may be captured using a smaller angle relative to the z axis. Using fewer optical sensors conserves power.

Figure 5B:
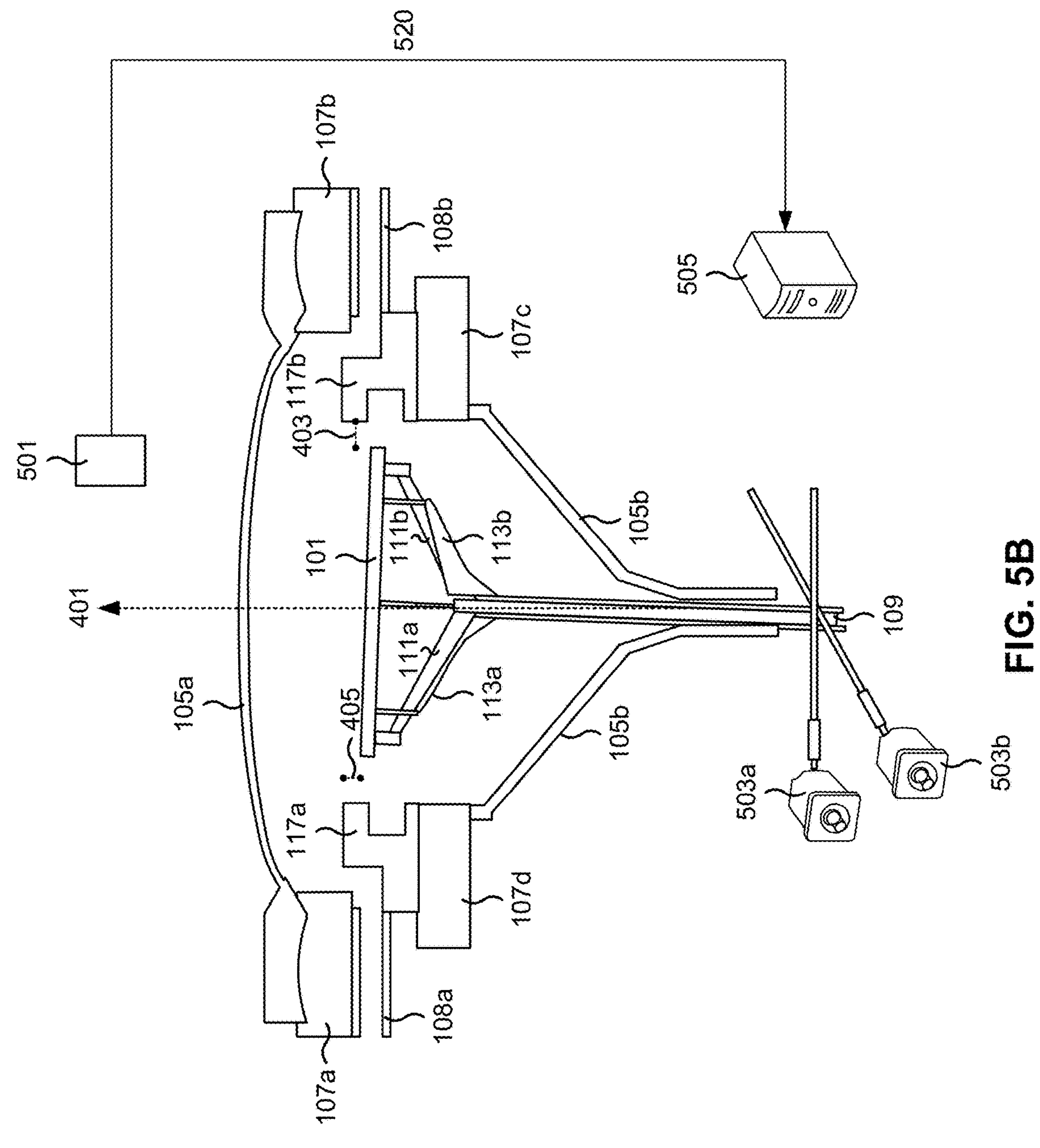

As shown in FIG. 5B, the controller 505 may receive one or more images from the at least one optical sensor 501 and determine at least one spacing measurement 403 and at least one gapping measurement 405 based on the image(s). For example, the controller 505 may calculate the measurements by identifying the susceptor 101 (e.g., using a color-based detector, a shape-based detector, a neural network detector, and/or another object detection technique) and identifying the pre-heat ring 117*a*/117*b* (e.g., using the same object detection technique or a different object detection technique). Additionally, the controller 505 may estimate distances between the identified susceptor 101 and the identified pre-heat ring 117*a*/117*b* (e.g., in a first direction associated with the spacing measurement 403 and/or in a second direction associated with the gapping measurement 405) by using one or more scales (e.g., stored in a memory) associated with the at least one optical sensor 501 and/or one or more reference objects in the image(s). For example, the view 510*a* may be associated with a scale and/or include a reference object from which the controller 505 can estimate distance. Similarly, the view 510*b* may be associated with a same scale and/or reference object or a different scale and/or reference object.

Although implementation 500 is depicted with the controller 505 receiving the images and performing the determination, other implementations may include the at least one optical sensor 501 performing the determination and providing the at least one spacing measurement 403 and at least one gapping measurement 405 to the controller 505. For example, using the at least one optical sensor 501 to perform the determination can reduce communication latency between the at least one optical sensor 501 and the controller 505 as well as reduce memory overhead at the controller 505. Using the controller 505 to perform the determination can reduce processing overhead at the least one optical sensor 501 and allow for use of a less complex optical sensor rather than a more complex optical sensor.

Figure 5C:
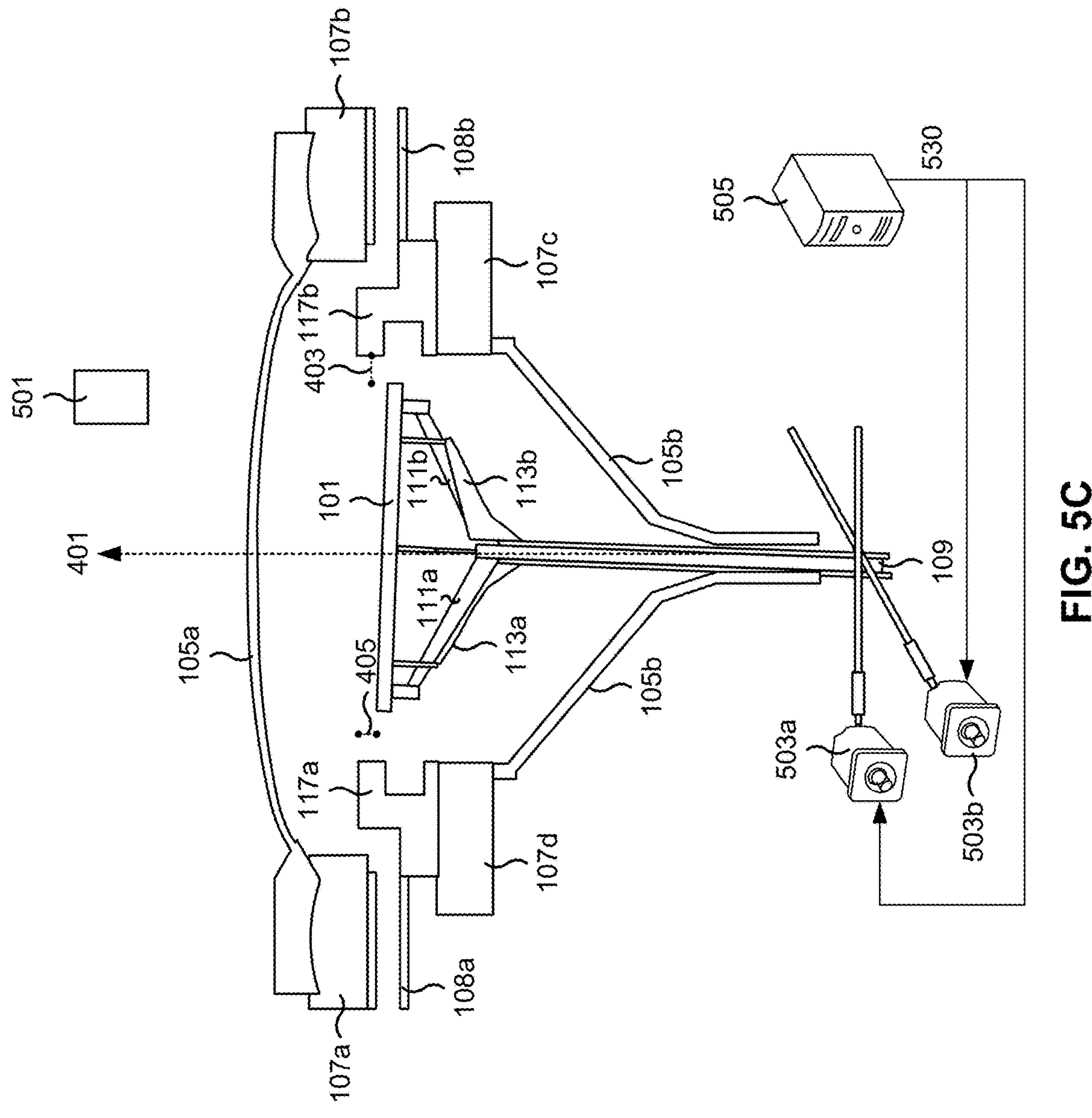

As shown in FIG. 5C, the controller 505 may generate commands for the motors 503*a* and 503*b* based on the spacing measurement 403, the gapping measurement 405, or a combination thereof. For example, the controller 505 may obtain (e.g., from memory), or otherwise receive (e.g., as input), a desired gapping and/or a desired spacing for the susceptor 101. In some implementations, the controller 505 receives an indication of a processing step to be performed by the semiconductor processing tool 100. Accordingly, the controller 505 may use a database (e.g., a relational database, such as a table, or another type of database) and/or another data structure to determine a desired gapping and/or a desired spacing associated with the processing step to be performed. In some implementations, the desired gapping and/or the desired spacing is based, at least in part, on a thickness of the pre-heat ring. For example, a thicker pre-heat ring may generate more heat such that the desired spacing and/or the desired gapping is larger as compared with a thinner pre-heat ring. Accordingly, the controller 505 may use properties of the semiconductor processing tool 100 (e.g., a model, a serial number, and/or another property associated with a thickness of the pre-heat ring) to determine the desired gapping and/or the desired spacing.

Accordingly, the controller 505 may determine a difference between the spacing measurement 403 and the desired spacing and/or a difference between the gapping measurement 405 and the desired gapping. The controller 505 may therefore generate commands for the motors 503*a* and 503*b* based on the difference(s). In some implementations, the controller 505 uses a database (e.g., a relational database, such as a table, or another type of database) and/or another data structure to determine the command(s) associated with reducing the difference(s). For example, the controller 505 may use the database to determine that a 1 mm movement of motor 503*a* and/or motor 503*b* is associated with a change in spacing and/or change in gapping, a 2 mm movement of motor 503*a* and/or motor 503*b* is associated with a different change in spacing and/or change in gapping, and so on. The data structure may be constructed iteratively using a plurality of tests and stored in memory for future use. Additionally with, or alternatively to, the data structure, the controller 505 may use an equation and/or another formula that accepts the difference(s) as input and outputs the command(s) for the motors 503*a* and 503*b*. The formula may be estimated from a plurality of tests and stored in memory for future use. In some implementations, a machine learning model generate the formula to use; for example, the model may accept inputs based on the plurality of tests and output the formula to use.

In some implementations, the controller 505 is configured to use a machine-learning model, which is trained based on historical data, to generate commands to move the motors 503*a* and 503*b*. For example, the machine-learning model may correlate historical changes in spacing and/or gapping and/or parameters associated with the motors 503*a* and 503*b*. Examples of historical parameters include model information associated with the motors 503*a* and 503*b*, operating voltages associated with the motors 503*a* and 503*b*, and/or movement ranges associated with the motors 503*a* and 503*b*, among other examples. For a combination of changes and/or parameters, the machine-learning model may have been trained to estimate commands to the motors 503*a* and 503*b* that result in changes to spacing and/or gapping. Accordingly, the machine-learning model may accept the difference between the spacing measurement 403 and the desired spacing and/or the difference between the gapping measurement 405 and the desired gapping and output the commands to provide to the motors 503*a* and 503*b*.

Motors 503*a* and 503*b* may each include pneumatic motors, servo motors, and/or other motors configured to move the column 109 vertically (e.g., to adjust gapping) and/or laterally (e.g., to adjust spacing). Although implementation 500 is depicted with two motors 503*a* and 503*b*, other implementations may include a single motor or more than two motors. For example, using additional motors provides more precise control over adjustments in gapping and spacing. This can reduce a quantity of iterations used to adjust the susceptor 101 (e.g., as described in greater detail below), which conserves power and processing resources overall. Using fewer motors conserves power during adjustments and consumes fewer processing resources at the controller 505 because fewer commands are generated and transmitted.

In some implementations, a rotational motor may be used in addition to, or in lieu of, motors 503*a* and 503*b*. Accordingly, the rotational motor may rotate the susceptor 101 during the processing step in order to further produce a consistent temperature profile across a wafer 103 on the susceptor 101. Additionally, in some implementations, the rotational motor moves the column 109 up and down so as to adjust the susceptor 101 vertically.

Figure 5D:
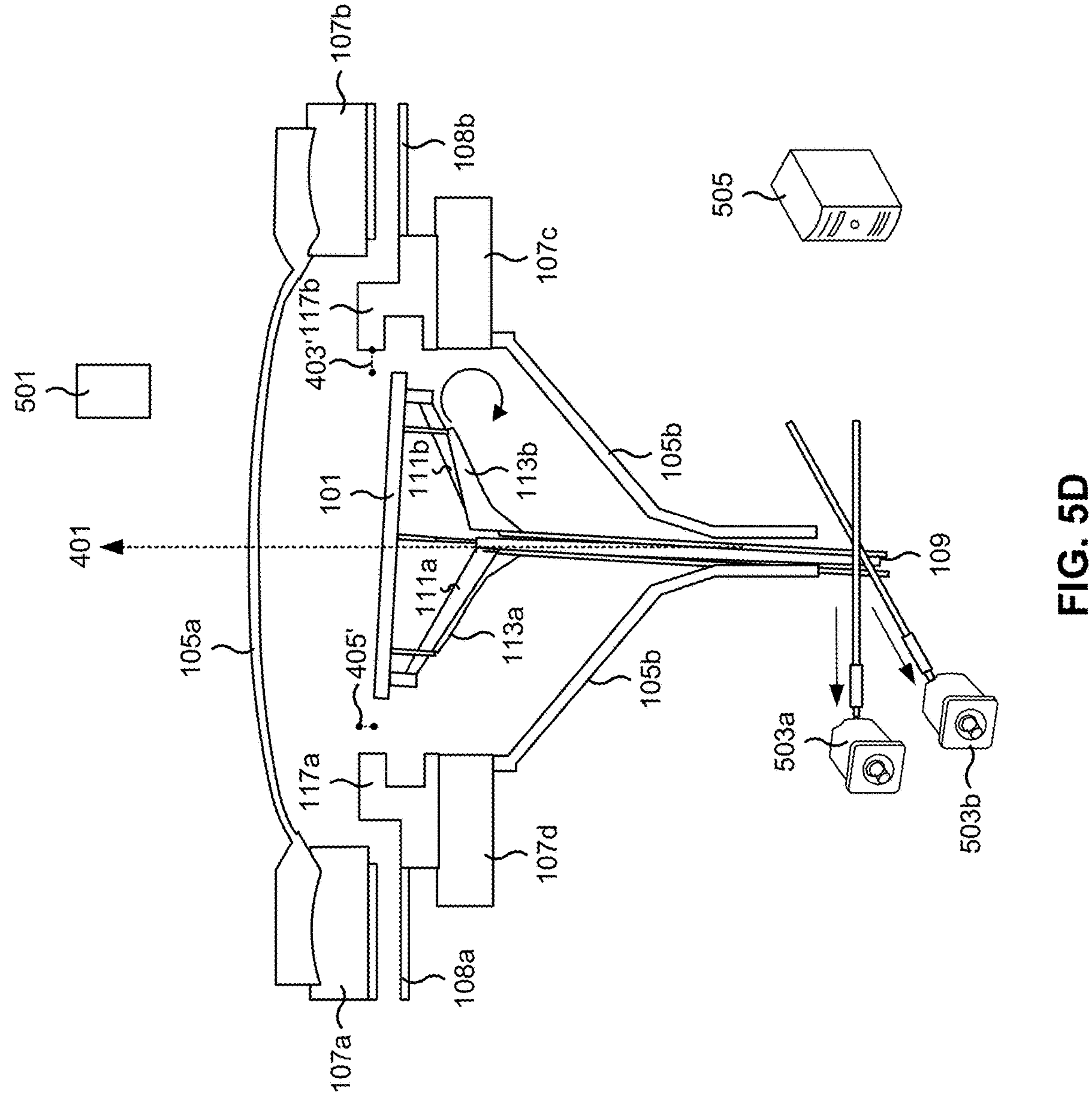

Accordingly, as shown in FIG. 5D, the susceptor 101 may be associated with an updated spacing measurement 403' and/or an updated gapping measurement 405' based on movement of the motors 503*a* and 503*b*. For example, the at least one optical sensor 501 may capture one or more updated images from which the controller 505 determines the updated spacing measurement 403' and/or the updated gapping measurement 405'. The controller 505 may determine whether to proceed with the processing step based on whether the updated spacing measurement 403' and/or the updated gapping measurement 405' satisfy a spacing threshold and/or a gapping threshold, respectively. For example, the spacing threshold and/or the gapping threshold may be determined using an acceptable error value relative to the desired spacing and/or the desired gapping, respectively.

When the updated spacing measurement 403' and/or the updated gapping measurement 405' do not satisfy the spacing threshold and/or the gapping threshold, respectively, the controller 505 may iteratively perform the process described in connection with FIGS. 5A-5D to further adjust the spacing and/or the gapping associated with the susceptor 101.

Once the updated spacing measurement 403' and/or the updated gapping measurement 405' satisfy the spacing threshold and/or the gapping threshold, respectively, the controller 505 may generate and provide a command to a susceptor blade to load a wafer 103 on the susceptor 101 (e.g., as described in connection with FIG. 6A). Although implementation 500 is depicted without a wafer 103, other implementations may include determining the spacing measurement 403 and/or the gapping measurement 405 after the wafer 103 is loaded on the susceptor 101. Determining the spacing measurement 403 and/or the gapping measurement 405 relative to the wafer 103 allows for adjusting the spacing and the gapping between deposition processes without removing the wafer 103 from the susceptor environment, as described in connection with FIGS. 6A-6H. As an alternative, determining spacing measurement 403 and/or the gapping measurement 405 relative to the wafer 103 allows for adjusting the spacing and the gapping for each additional wafer loaded on the susceptor 101 for the same processing step. Accordingly, the semiconductor processing tool 100 produces more consistent epitaxial growth structures across different wafers, which results in fewer materials that are wasted.

Once the wafer 103 is loaded, the controller 505 may generate and provide a command to the semiconductor processing tool 100 to perform the processing step (e.g., as described in connection with FIG. 6E). In some implementations, the controller 505 additionally generates and provides a command to the rotational motor to rotate the susceptor 101 during the processing step. Once the processing step is complete (e.g., as determined when the controller 505 receives a signal from the semiconductor processing tool 100 indicating that the processing step is complete), the controller 505 may generate and provide a command to a susceptor blade to unload the wafer 103 from the susceptor 101 (e.g., as described in connection with FIG. 6H). In some implementations, the controller 505 additionally generates and provides a command to the rotational motor to stop rotating the susceptor 101 after the processing step is complete.

By adjusting the susceptor 101 as described in connection with implementation 500, the susceptor 101 is adjusted more quickly and accurately. Additionally, the susceptor 101 is adjusted without disturbing the vacuum within the susceptor environment, which decreases a chance of impurities entering the environment and spoiling deposition processes. Fewer spoiled deposition processes result in less production time that is lost and fewer materials that are wasted.

The number and arrangement of components shown in FIGS. 5A-5D are provided as an example. The implementation may include additional components, fewer components, different components, or differently arranged components than those shown in FIGS. 5A-5D. Additionally, or alternatively, a set of components (e.g., one or more components) of FIGS. 5A-5D may perform one or more functions described as being performed by another set of components of FIGS. 5A-5D.

FIGS. 6A-6H are diagrams of an example implementation 600 associated with adjusting spacing and/or gapping of a susceptor in a semiconductor processing tool (e.g., an epitaxial growth tool). Example implementation 600 may use the semiconductor processing tool 100 of FIG. 1, which includes a susceptor 101, dome portions 105*a*, 105*b*, and 105*c*, sidewall portions 107*a*, 107*b*, 107*c*, and 107*d*, passages 108*a* and 108*b*, support 109 with arms 111*a* and 111*b*, and a lifting mechanism with arms 113*a* and 113*b*. These components are described in more detail in connection with FIGS. 1-4. Example implementation 600 further includes at least one optical sensor 501 (e.g., a camera or other optical sensor), motors 503*a* and 503*b*, controller 505, and susceptor blade 601. These components are described in more detail below and/or in connection with FIG. 8.

Figure 6A:
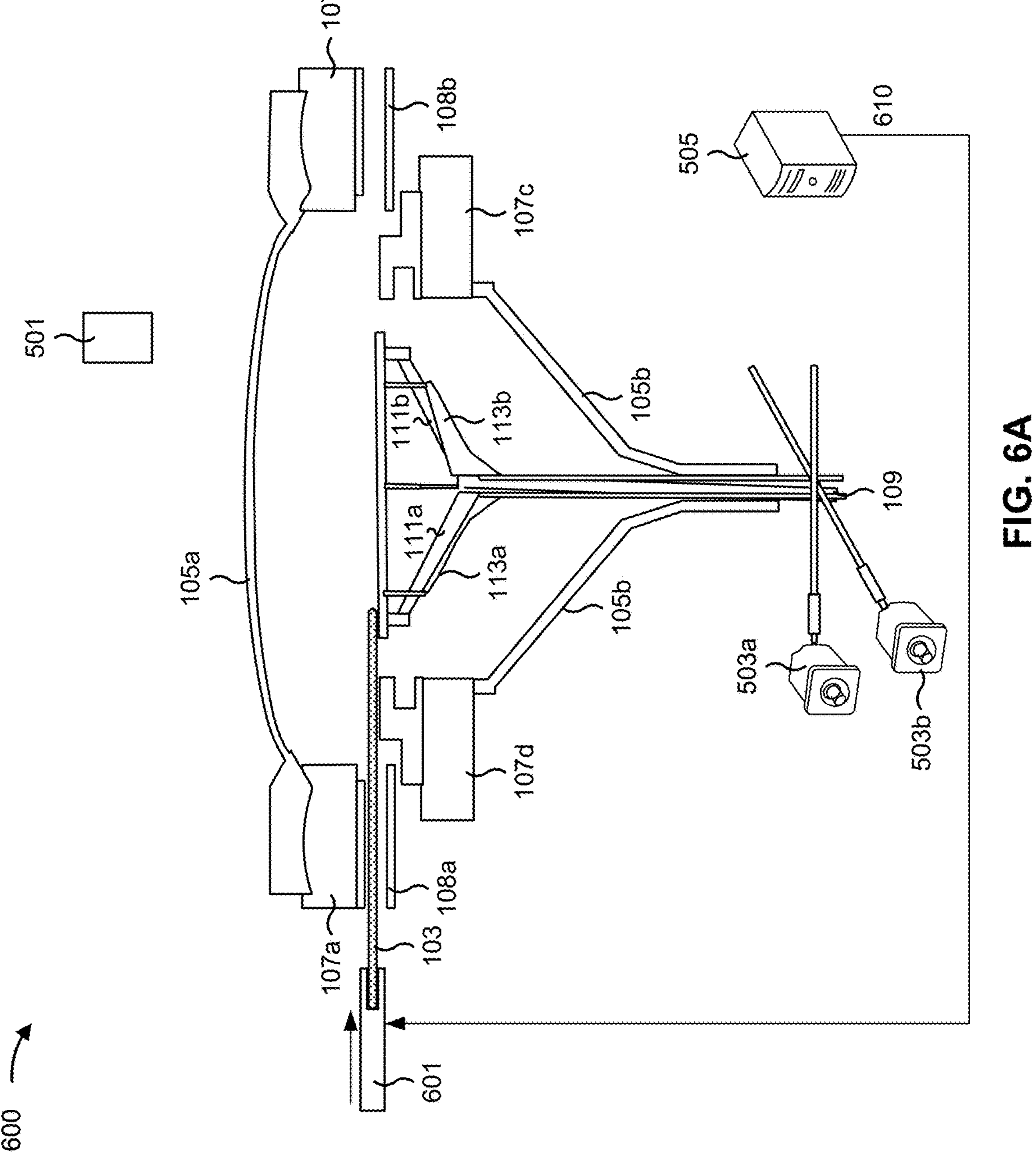
FIGS. 6A-6H are diagrams of an example implementation described herein.

As shown in FIG. 6A, the controller 505 may generate and provide a command to the susceptor blade 601 to load a wafer 103 on the susceptor 101. The susceptor blade 601 (also referred to as a conveying blade) may include a metal or plastic blade that is substantially U-shaped or otherwise configured to hold the wafer 103. Accordingly, the susceptor blade 601 may convey the wafer 103 through the passage 108*a* into the susceptor environment in order to preserve at least a partial vacuum therein. The susceptor blade 601 may be pushed through the passage 108*a* by a robotic arm, a pneumatic motor, and/or another mechanism configured to push the susceptor blade 601 into the susceptor environment and pull the susceptor blade 601 out of the susceptor environment. Once the wafer 103 is set on lift pins (such as lift pins 115*a* and 115*b*), the susceptor blade 601 releases the wafer 103 (e.g., by moving such that the weight of the wafer 103 is supported by the lift pins and not the susceptor blade 601 and/or by opening the U-shaped portion of the susceptor blade 601 further) and is pulled out of the passage 108*a*.

Figure 6B:
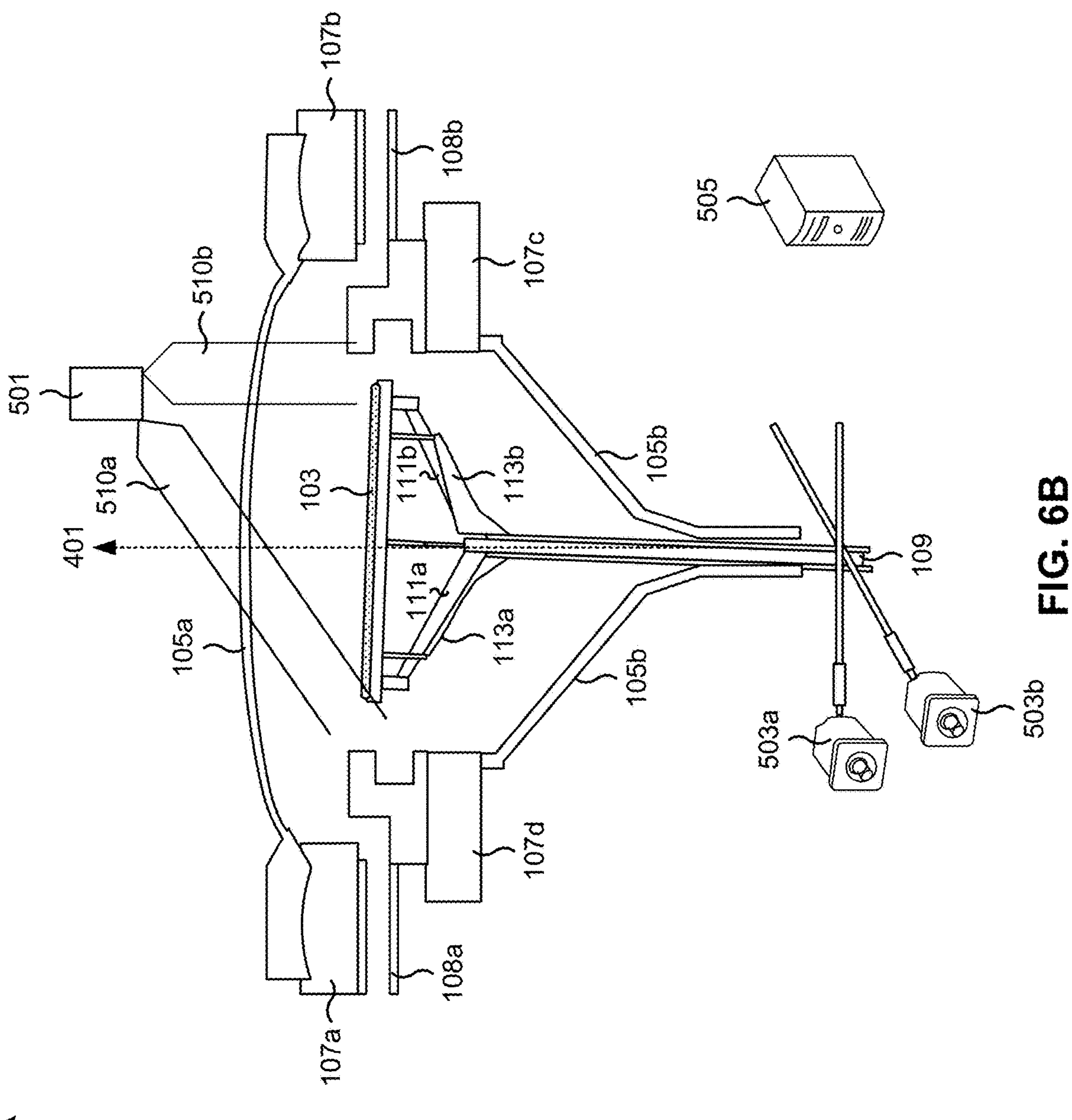

As shown in FIG. 6B, and similar to FIG. 5A, the at least one optical sensor 501 may capture one or more images associated with the susceptor 101. In some implementations, the at least one optical sensor 501 captures images associated with a plurality of views of the susceptor 101, such as views 510*a* and 510*b*. The at least one optical sensor 501 may include different groups of pixels that capture views 510*a* and 510*b* simultaneously.

Figure 6C:
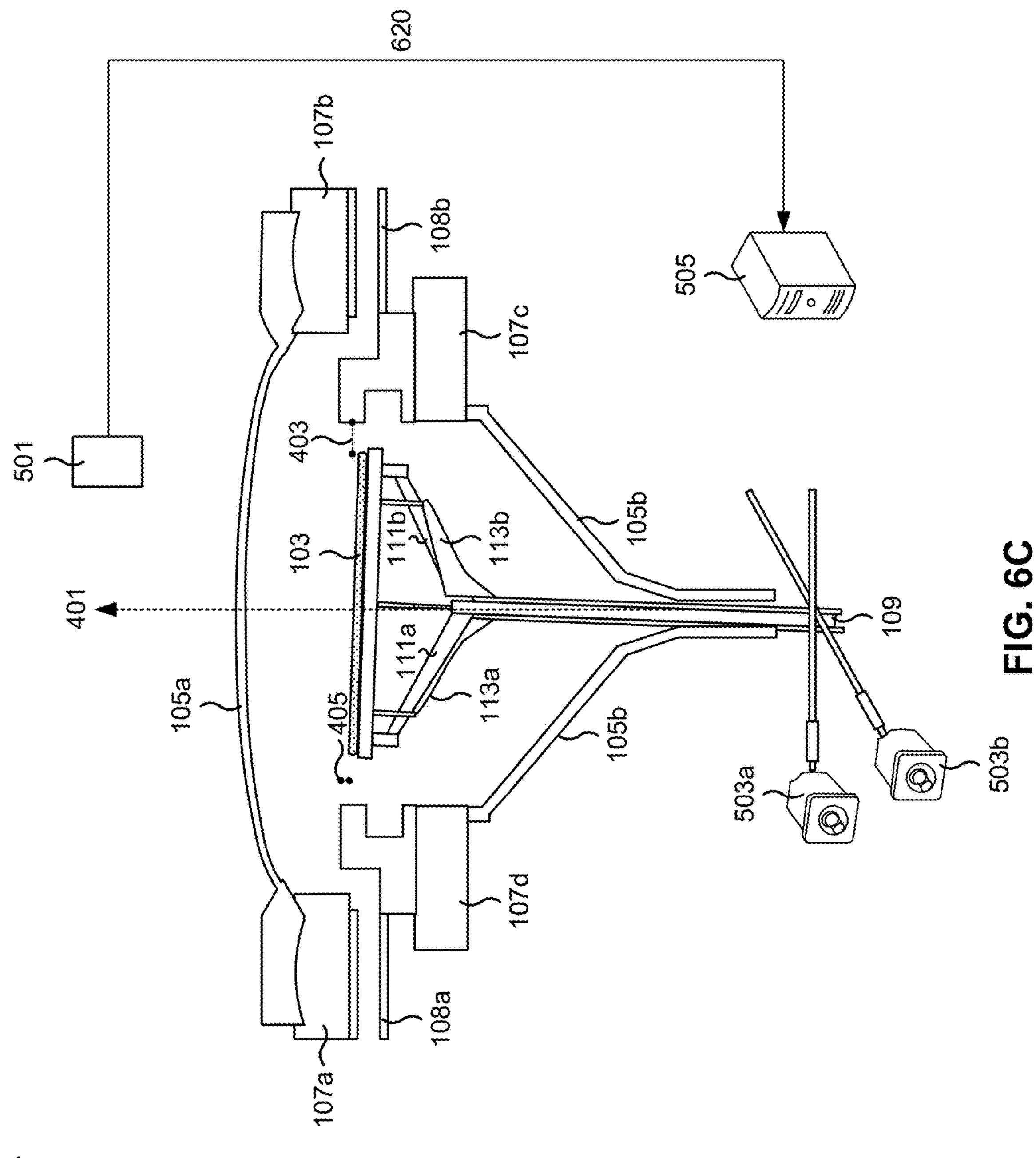

As shown in FIG. 6C, and similar to FIG. 5B, the controller 505 may receive one or more images from the at least one optical sensor 501 and determine at least one spacing measurement 403 and at least one gapping measurement 405 based on the image(s). For example, the controller 505 may calculate the measurements by identifying the susceptor 101 or the wafer 103 (e.g., using a color-based detector, a shape-based detector, a neural network detector, and/or another object detection technique) and identifying the pre-heat ring 117*a*/117*b* (e.g., using the same object detection technique or a different object detection technique). Additionally, the controller 505 may estimate distances between the identified susceptor 101 (or the identifier wafer 103) and the identified pre-heat ring 117*a*/117*b* (e.g., in a first direction associated with the spacing measurement 403 and/or in a second direction associated with the gapping measurement 405) by using one or more scales (e.g., stored in a memory) associated with the at least one optical sensor 501 and/or one or more reference objects in the image(s). For example, the view 510*a* may be associated with a scale and/or include a reference object from which the controller 505 can estimate distance. Similarly, the view 510*b* may be associated with a same scale and/or reference object or a different scale and/or reference object.

Figure 6D:
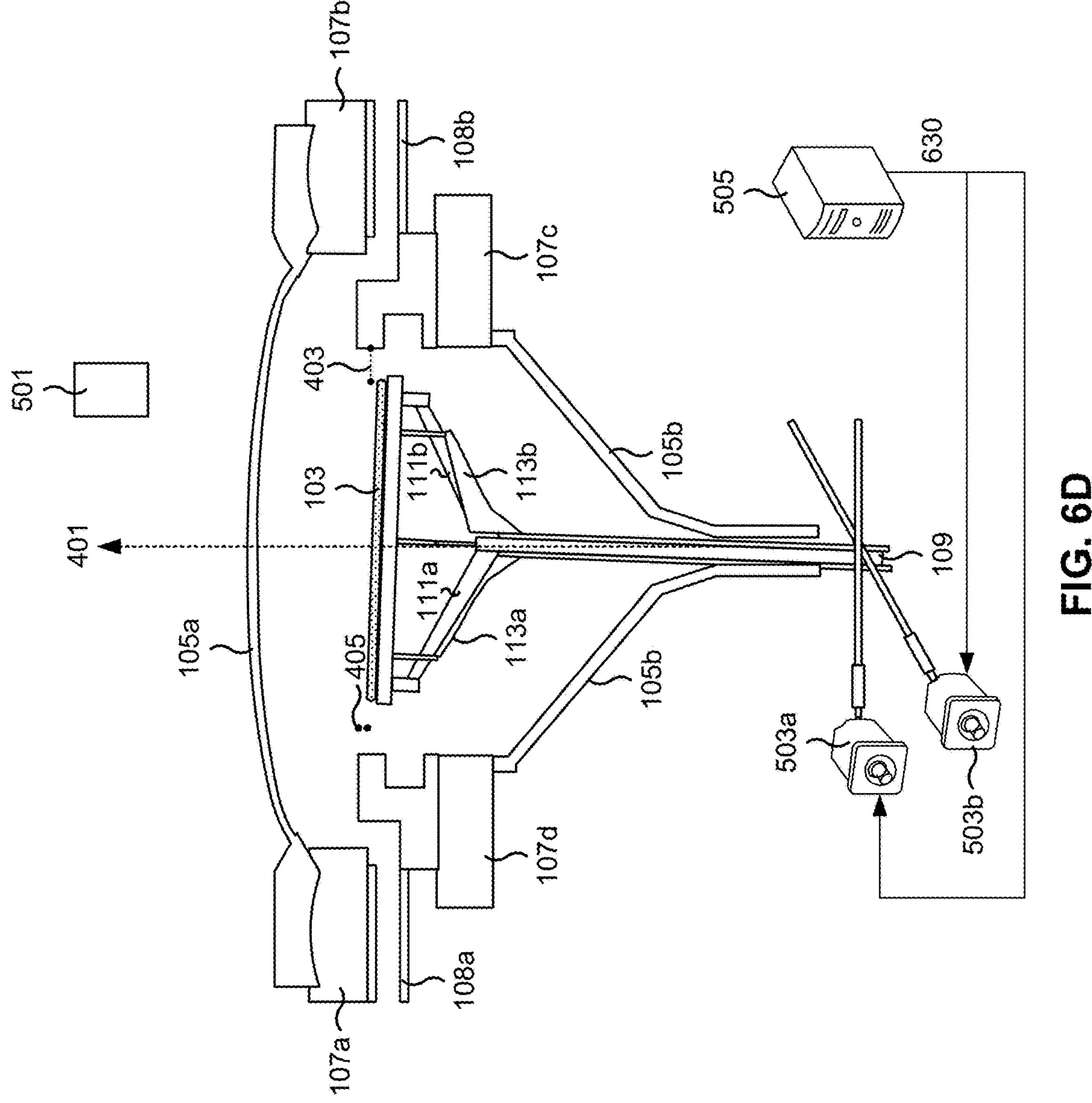

As shown in FIG. 6D, and similar to FIG. 5C, the controller 505 may generate commands for the motors 503*a* and 503*b* based on the spacing measurement 403, the gapping measurement 405, or a combination thereof. For example, the controller 505 may obtain (e.g., from memory), or otherwise receive (e.g., as input), a desired gapping and/or a desired spacing for the susceptor 101. In some implementations, the controller 505 receives an indication of a processing step to be performed by the semiconductor processing tool 100. Accordingly, the controller 505 may use a database (e.g., a relational database, such as a table, or another type of database) and/or another data structure to determine a desired gapping and/or a desired spacing associated with the processing step to be performed.

Figure 6E:
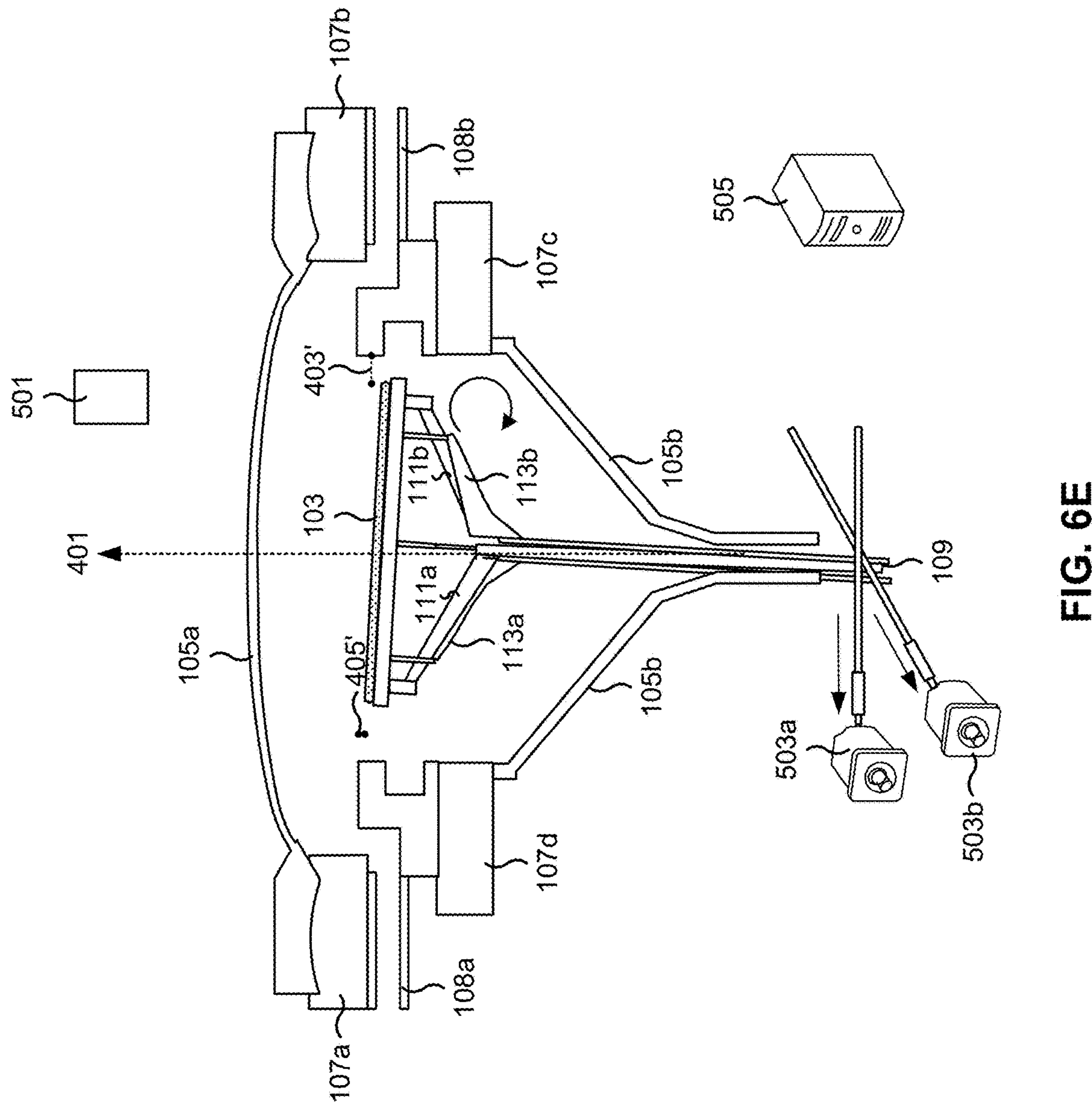

Accordingly, as shown in FIG. 6E, the susceptor 101 may be associated with an updated spacing measurement 403' and/or an updated gapping measurement 405' based on movement of the motors 503*a* and 503*b*. For example, the at least one optical sensor 501 may capture one or more updated images from which the controller 505 determines the updated spacing measurement 403' and/or the updated gapping measurement 405'. The controller 505 may determine whether to proceed with the processing step based on whether the updated spacing measurement 403' and/or the updated gapping measurement 405' satisfy a spacing threshold and/or a gapping threshold, respectively. For example, the spacing threshold and/or the gapping threshold may be determined using an acceptable error value relative to the desired spacing and/or the desired gapping, respectively.

When the updated spacing measurement 403' and/or the updated gapping measurement 405' do not satisfy the spacing threshold and/or the gapping threshold, respectively, the controller 505 may iteratively perform the process described in connection with FIGS. 6B-6E to further adjust the spacing and/or the gapping associated with the susceptor 101.

Once the updated spacing measurement 403' and/or the updated gapping measurement 405' satisfy the spacing threshold and/or the gapping threshold, respectively, the controller 505 may generate and provide a command to the semiconductor processing tool 100 to perform the processing step. In some implementations, the controller 505 additionally generates and provides a command to a rotational motor to rotate the susceptor 101 during the processing step.

Figure 6F:
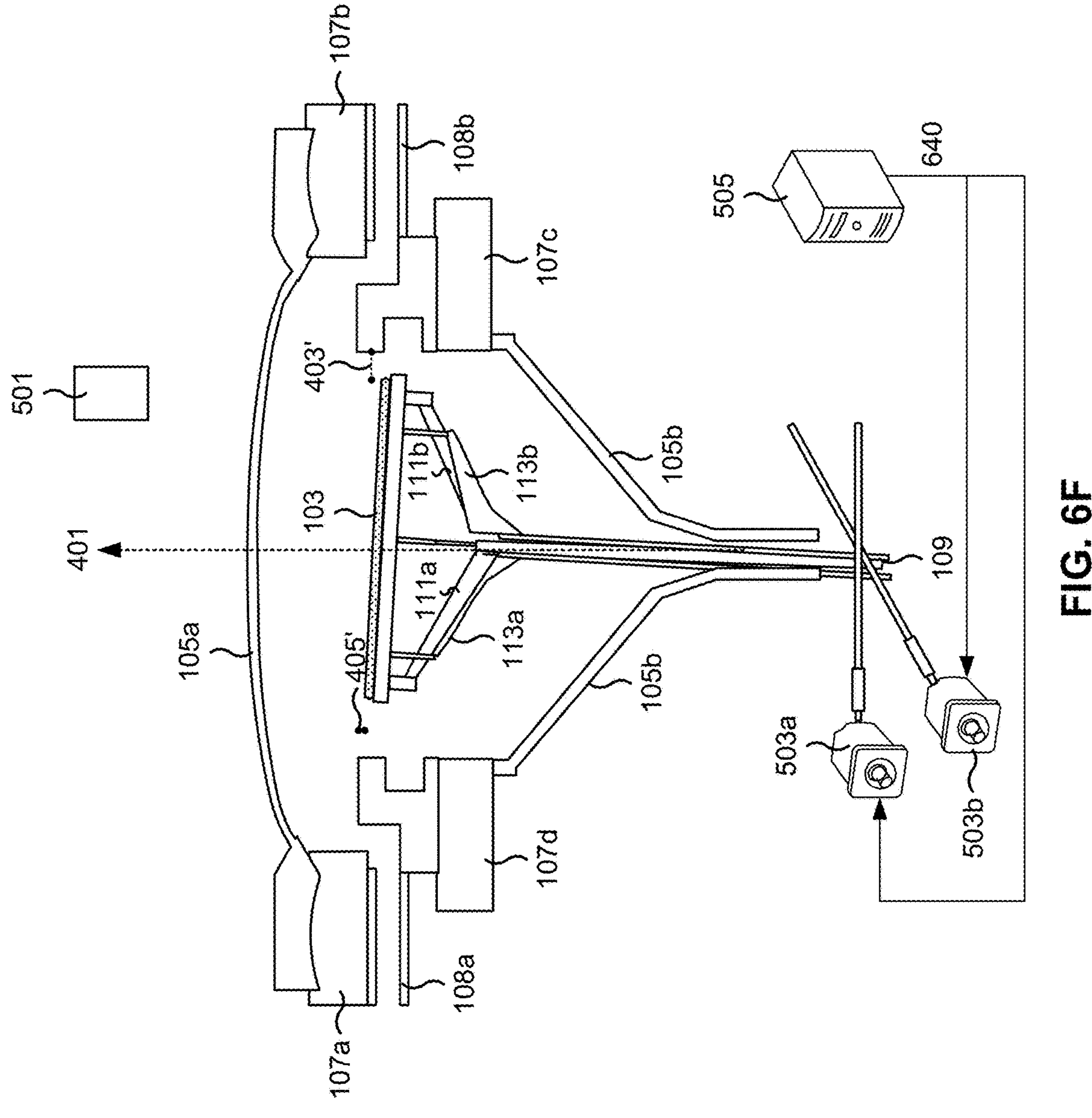

As shown in FIG. 6F, once the processing step is complete, the controller 505 may generate commands for the motors 503*a* and 503*b* based on the updated spacing measurement 403', the updated gapping measurement 405', or a combination thereof. In some implementations, the controller 505 may use the updated spacing measurement 403' and/or the updated gapping measurement 405' previously determined (e.g., as described in connection with FIG. 6E) or may receive one or more updates images from the at least on optical sensor 501 used to re-determine the updated spacing measurement 403' and/or the updated gapping measurement 405'. Additionally, the controller 505 may obtain (e.g., from memory), or otherwise receive (e.g., as input), an additional desired gapping and/or an additional desired spacing for the susceptor 101. In some implementations, the controller 505 receives an indication of an additional processing step to be performed by the semiconductor processing tool 100 on the wafer 103. Accordingly, the controller 505 may use a database (e.g., a relational database, such as a table, or another type of database) and/or another data structure to determine the additional desired gapping and/or the additional desired spacing associated with the additional processing step to be performed.

Accordingly, the controller 505 may determine a difference between the updated spacing measurement 403' and the additional desired spacing and/or a difference between the updated gapping measurement 405' and the additional desired gapping. The controller 505 may therefore generate commands for the motors 503*a* and 503*b* based on the difference(s).

Figure 6G:
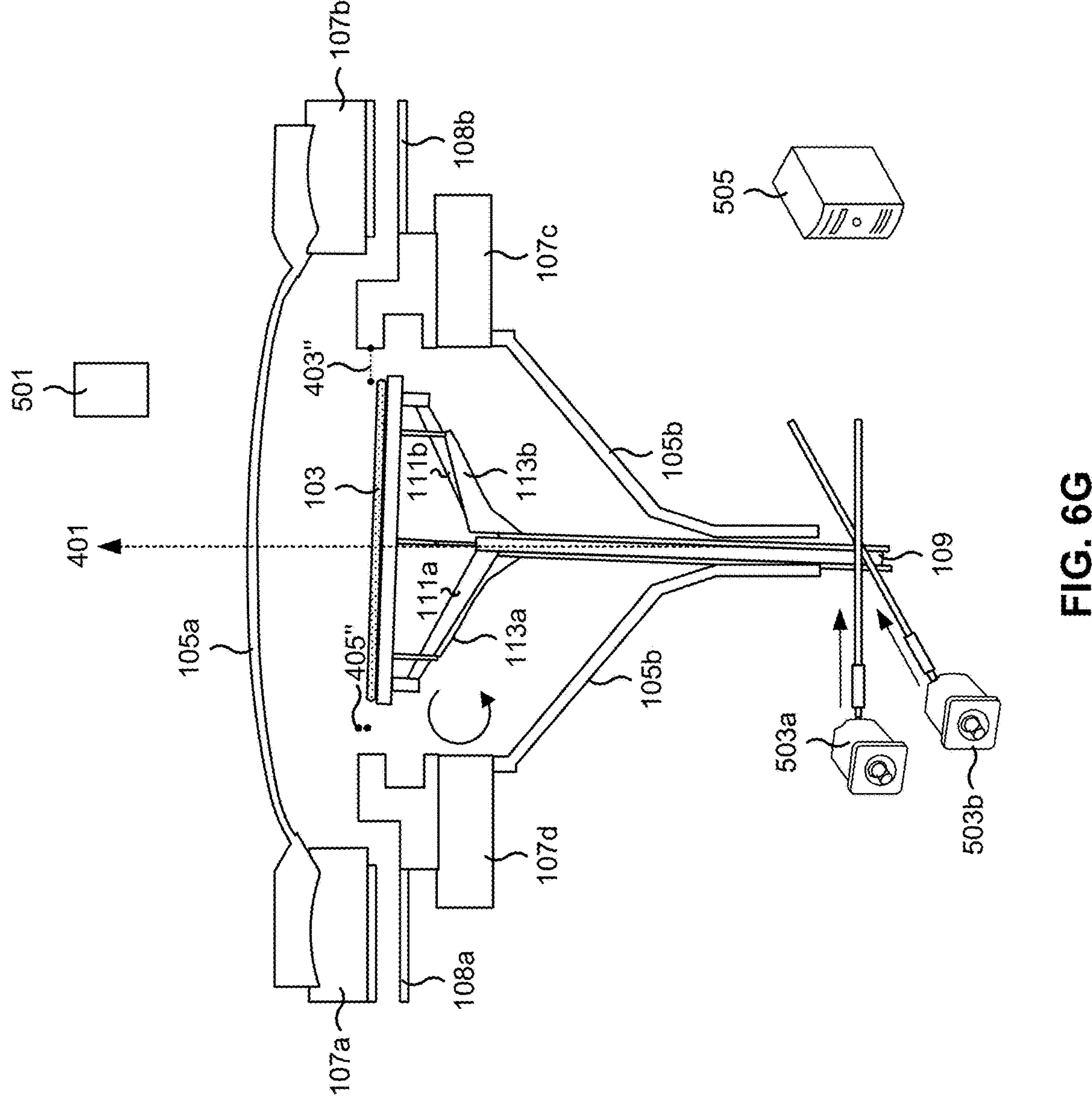

Accordingly, as shown in FIG. 6G, the susceptor 101 may be associated with an updated spacing measurement 403" and/or an updated gapping measurement 405" based on movement of the motors 503*a* and 503*b*. For example, the at least one optical sensor 501 may capture one or more updated images from which the controller 505 determines the updated spacing measurement 403" and/or the updated gapping measurement 405". The controller 505 may determine whether to proceed with the processing step based on whether the updated spacing measurement 403" and/or the updated gapping measurement 405" satisfy a spacing threshold and/or a gapping threshold, respectively. For example, the spacing threshold and/or the gapping threshold may be determined using an acceptable error value relative to the additional desired spacing and/or the additional desired gapping, respectively.

When the updated spacing measurement 403" and/or the updated gapping measurement 405" do not satisfy the spacing threshold and/or the gapping threshold, respectively, the controller 505 may iteratively perform the process described in connection with FIGS. 6B-6E to further adjust the spacing and/or the gapping associated with the susceptor 101.

Once the updated spacing measurement 403" and/or the updated gapping measurement 405" satisfy the spacing threshold and/or the gapping threshold, respectively, the controller 505 may generate and provide a command to the semiconductor processing tool 100 to perform the additional processing step. In some implementations, the controller 505 additionally generates and provides a command to a rotational motor to rotate the susceptor 101 during the additional processing step.

Figure 6H:
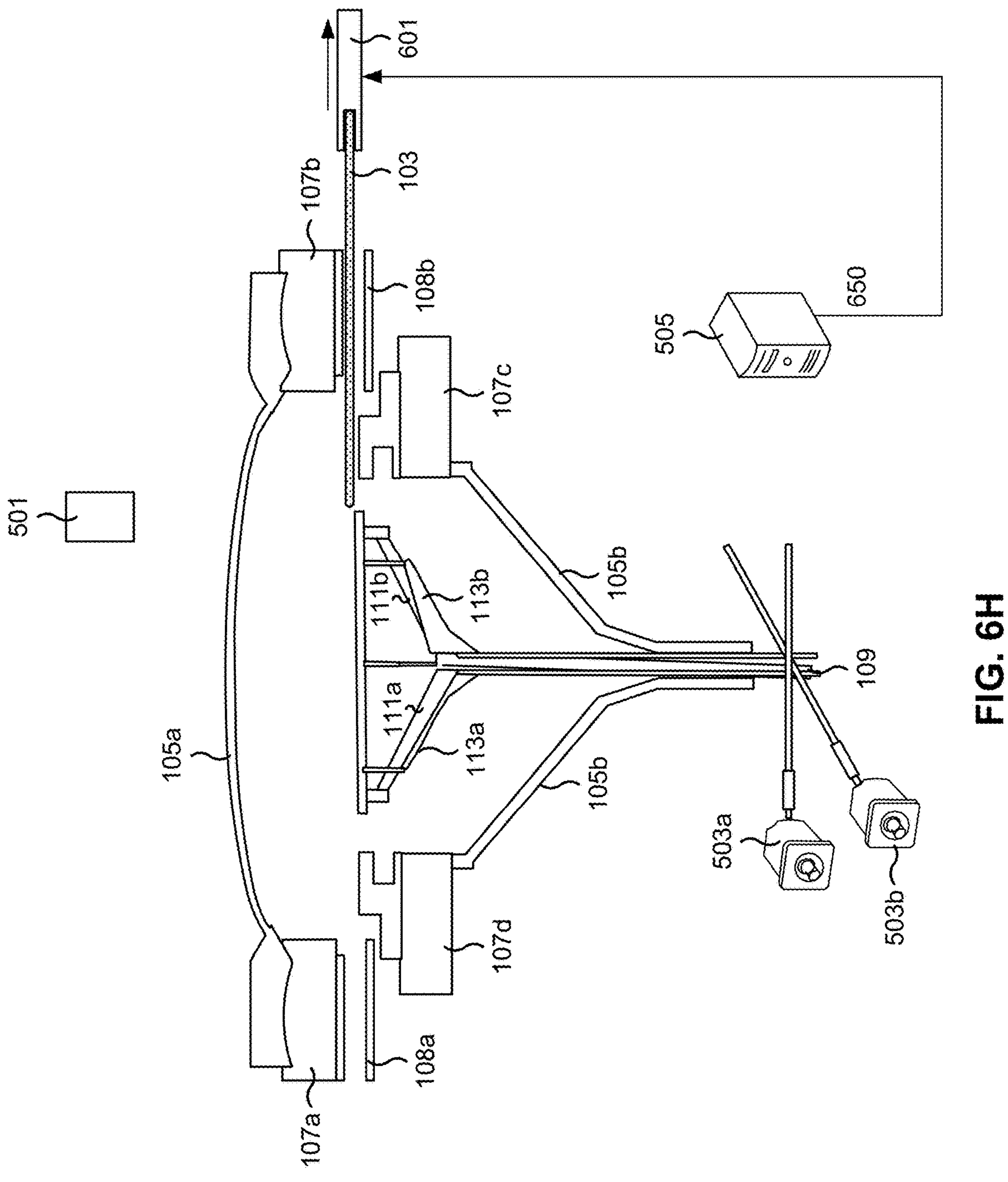

As shown in FIG. 6H, once the additional processing step is complete (e.g., as determined when the controller 505 receives a signal from the semiconductor processing tool 100 indicating that the additional processing step is complete), the controller 505 may generate and provide a command to a susceptor blade 601 to unload the wafer 103 from the susceptor 101. Accordingly, the susceptor blade 601 may convey the wafer 103 through the passage 108*b* out of the susceptor environment in order to preserve at least a partial vacuum therein. The susceptor blade 601 may be pushed through the passage 108*b* by a robotic arm, a pneumatic motor, and/or another mechanism configured to push the susceptor blade 601 into the susceptor environment and pull the susceptor blade 601 out of the susceptor environment. The wafer 103 is raised on lift pins (such as lift pins 115*a* and 115*b*) such that the susceptor blade 601 grabs the wafer 103 (e.g., by moving such that the weight of the wafer 103 is supported by the susceptor blade 601 and not the lift pins and/or by closing the U-shaped portion of the susceptor blade 601 on the wafer 103) and is pulled out of the passage 108*b*.

In some implementations, the controller 505 additionally generates and provides a command to the rotational motor to stop rotating the susceptor 101 after the processing step is complete. Although described with reference to two processing steps, implementation 600 may further include additional processing steps with corresponding adjustments of spacing and/or gapping associated with the susceptor 101.

By adjusting the susceptor 101 as described in connection with implementation 600, an epitaxial structure (e.g., as described in connection with FIGS. 7A-7E) may be formed on the wafer 103 without removing the wafer 103 from the susceptor 101 between deposition processes. As a result, production time is reduced. Additionally, the susceptor 101 is adjusted between deposition processes without disturbing the vacuum, which decreases a chance of impurities entering the environment and spoiling later deposition processes, and without moving the wafer 103, which decreases a chance of the wafer 103 being scratched or otherwise damaged during movement. Fewer spoiled deposition processes and fewer damaged wafers result in less production time that is lost and fewer materials that are wasted.

The number and arrangement of components shown in FIGS. 6A-6H are provided as an example. The implementation may include additional components, fewer components, different components, or differently arranged components than those shown in FIGS. 6A-6H. Additionally, or alternatively, a set of components (e.g., one or more components) of FIGS. 6A-6H may perform one or more functions described as being performed by another set of components of FIGS. 6A-6H.

Figure 7A:
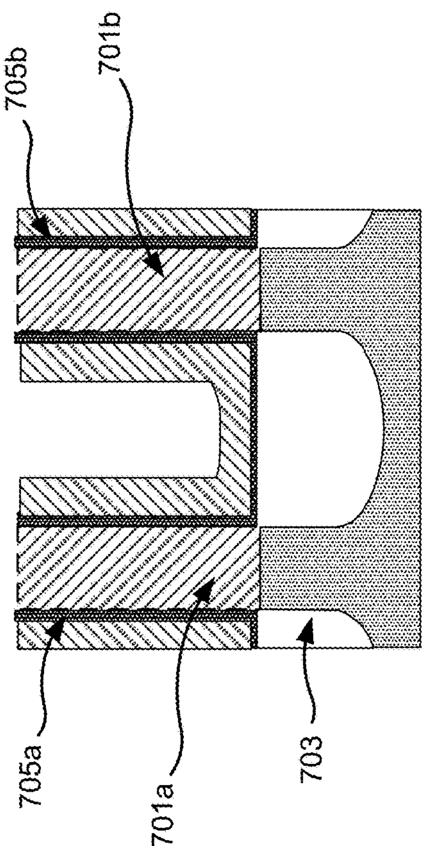
Figure 7A:
Figure 7B:
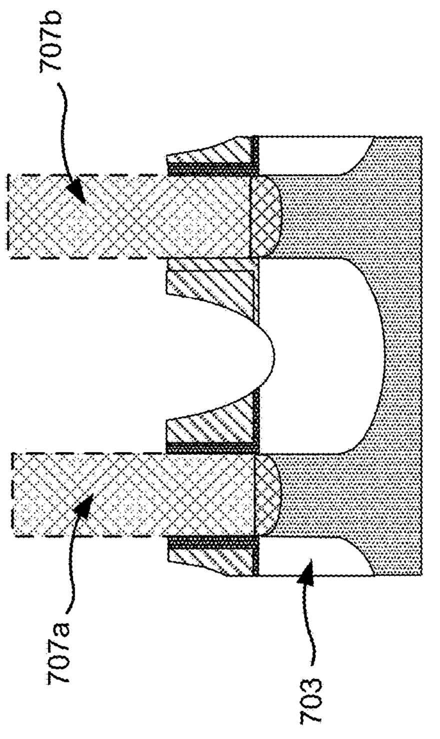
Figure 7B:
Figure 7C:
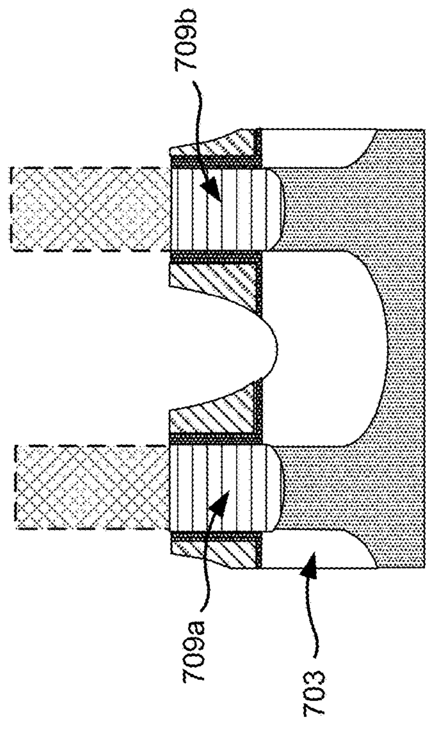
Figure 7C:

FIGS. 7A-7E are diagrams of an example implementation 700 associated with depositions using the semiconductor processing tool 100 of FIG. 1. As shown in FIG. 7A, a semiconductor structure may include a plurality of fins 701*a* and 701*b* with fin side wall spacers 705*a* and 705*b* formed on an epilayer and separate by shallow trench isolation (STI) structure 703. In some implementations, the fins 701*a* and 701*b* each are associated with a height in a range from approximately 40 nanometers (nm) to approximately 80 nm above the STI structure 703. Accordingly, as shown in FIG. 7B, the fins 701*a* and 701*b* are etched to form recesses 707*a* and 707*b* such that, as shown in FIG. 7C, doped regions 709*a* and 709*b* may be deposited therein. In some implementations, the fins 701*a* and 701*b* are etched in a range from approximately 2 nm to approximately 10 nm below the STI structure 703. Additionally, the doped regions 709*a* and 709*b* are deposited to a depth in a range from approximately 1 nm to approximately 15 nm.

Figure 7D:
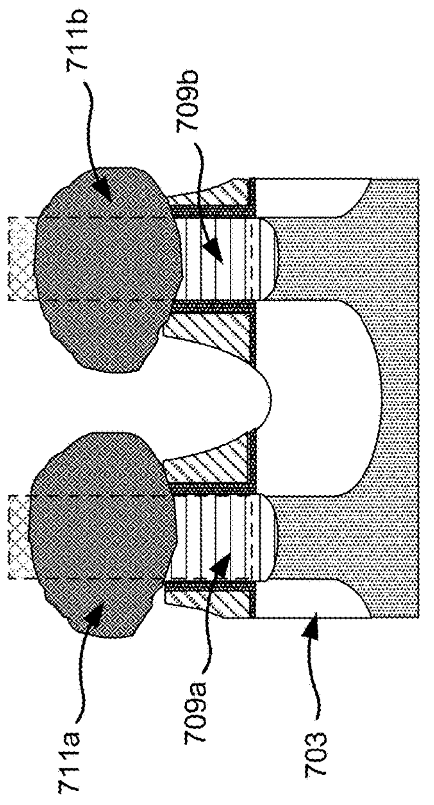
Figure 7D:

Additionally, using the semiconductor processing tool 100 of FIG. 1 and as shown in FIG. 7D, epitaxial layers 711*a* and 711*b* may be deposited on the doped regions 709*a* and 709*b*. In some implementations, the epitaxial layers 711*a* and 711*b* are deposited to a depth in a range from approximately 10 nm to approximately 35 nm. Furthermore, using the semiconductor processing tool 100 of FIG. 1 and as shown in FIG. 7E, epitaxial layers 713*a* and 713*b* may be deposited on the epitaxial layers 711*a* and 711*b*. In some implementations, the epitaxial layers 713*a* and 713*b* are deposited to a depth in a range from approximately 20 nm to approximately 55 nm.

Accordingly, the combination of epitaxial layers 711*a* and 711*b* with epitaxial layers 713*a* and 713*b* form a source region or a drain region on a wafer (e.g., wafer 103). As shown in FIG. 7E, the epitaxial layers 713*a* and 713*b* may merge in a wavy pattern with a height, at a merging region. Additionally, as shown in FIG. 7E, the epitaxial layers 713*a* and 713*b* may grow a width of the source region or the drain region wider than provided by the epitaxial layers 711*a* and 711*b*. Using the techniques as described in connection with FIGS. 5A-5D and/or FIGS. 6A-6H to control the spacing and gapping of the susceptor 101 during the deposition processes can help achieve source regions and drain regions on the wafer 103 that are more consistent in one or more of the measurements described above, which results in fewer defective source regions and drain regions across the wafer 103. As a result, wafer size can be reduced and productive time and materials conserved. For example, the techniques described in connection with FIGS. 5A-5D may be used before a wafer enters the chamber with recessed fins 701*a* and 701*b* in order to control the spacing and gapping during deposition of the doped regions 709*a* and 709*b*. As an alternative, the techniques described in connection with FIGS. 6A-6H may be used after the wafer enters the chamber with recessed fins 701*a* and 701*b* in order to control the spacing and gapping during deposition of the doped regions 709*a* and 709*b*. Additionally, the techniques described in connection with FIGS. 6A-6H may be used in situ between deposition of the doped regions 709*a* and 709*b* and deposition of the epitaxial layers 711*a* and 711*b* and/or between deposition of the epitaxial layers 711*a* and 711*b* and the epitaxial layers 713*a* and 713*b* in order to control the spacing and gapping.

The number and arrangement of components shown in FIGS. 7A-7E are provided as an example. The implementation may include additional components, fewer components, different components, or differently arranged components than those shown in FIGS. 7A-7E.

Figure 8:
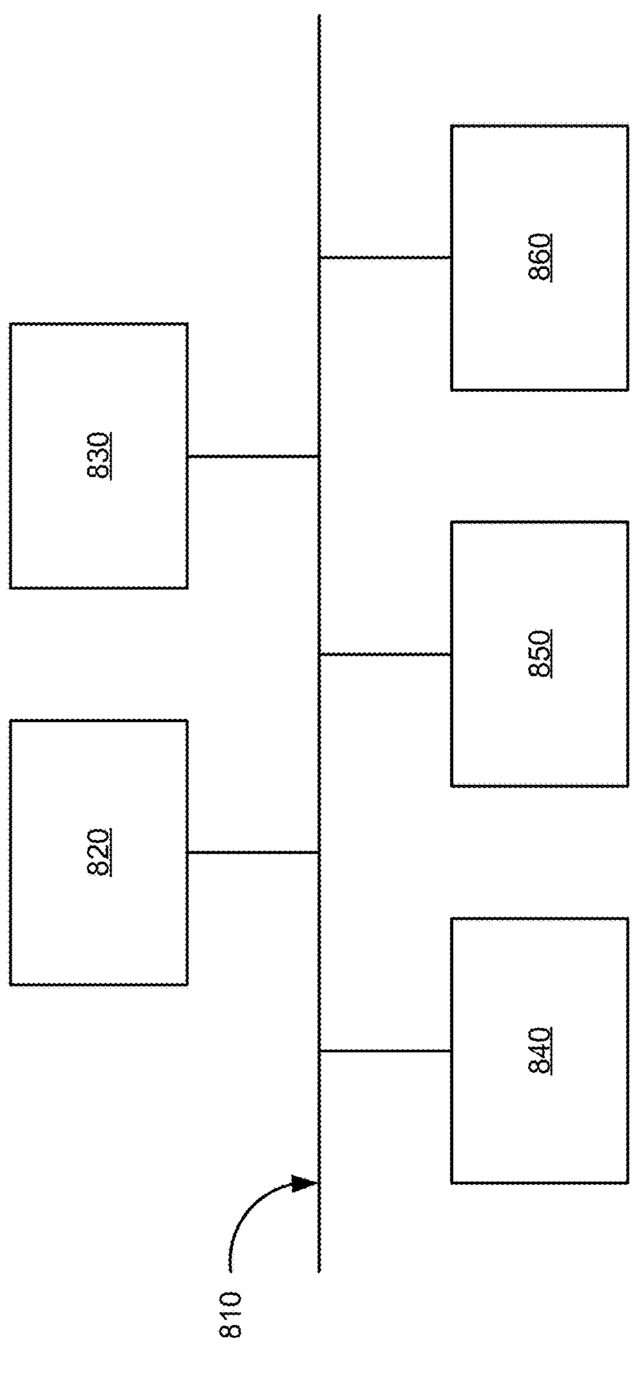
FIG. 8 is a diagram of example components of one or more devices of FIG. 1 described herein.

FIG. 8 is a diagram of example components of a device 800, which may correspond to a controller (e.g., controller 505), an optical sensor (e.g., at least one optical sensor 501), a motor (e.g., motor 503*a*, motor 503*b*, and/or another motor), and/or a susceptor blade (e.g., blade 601). In some implementations, a controller, an optical sensor, a motor and/or a susceptor blade may include one or more devices 800 and/or one or more components of device 800. As shown in FIG. 8, device 800 may include a bus 810, a processor 820, a memory 830, an input component 840, an output component 850, and a communication component 860.

Bus 810 includes one or more components that enable wired and/or wireless communication among the components of device 800. Bus 810 may couple together two or more components of FIG. 8, such as via operative coupling, communicative coupling, electronic coupling, and/or electric coupling. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform one or more operations or processes described elsewhere herein.

Memory 830 includes volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory 830 may be a non-transitory computer-readable medium. Memory 830 stores information, instructions, and/or software (e.g., one or more software applications) related to the operation of device 800. In some implementations, memory 830 includes one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry may be used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
FIG. 9 is a flowchart of an example process relating to using a semiconductor processing tool described herein.
Figure 9:
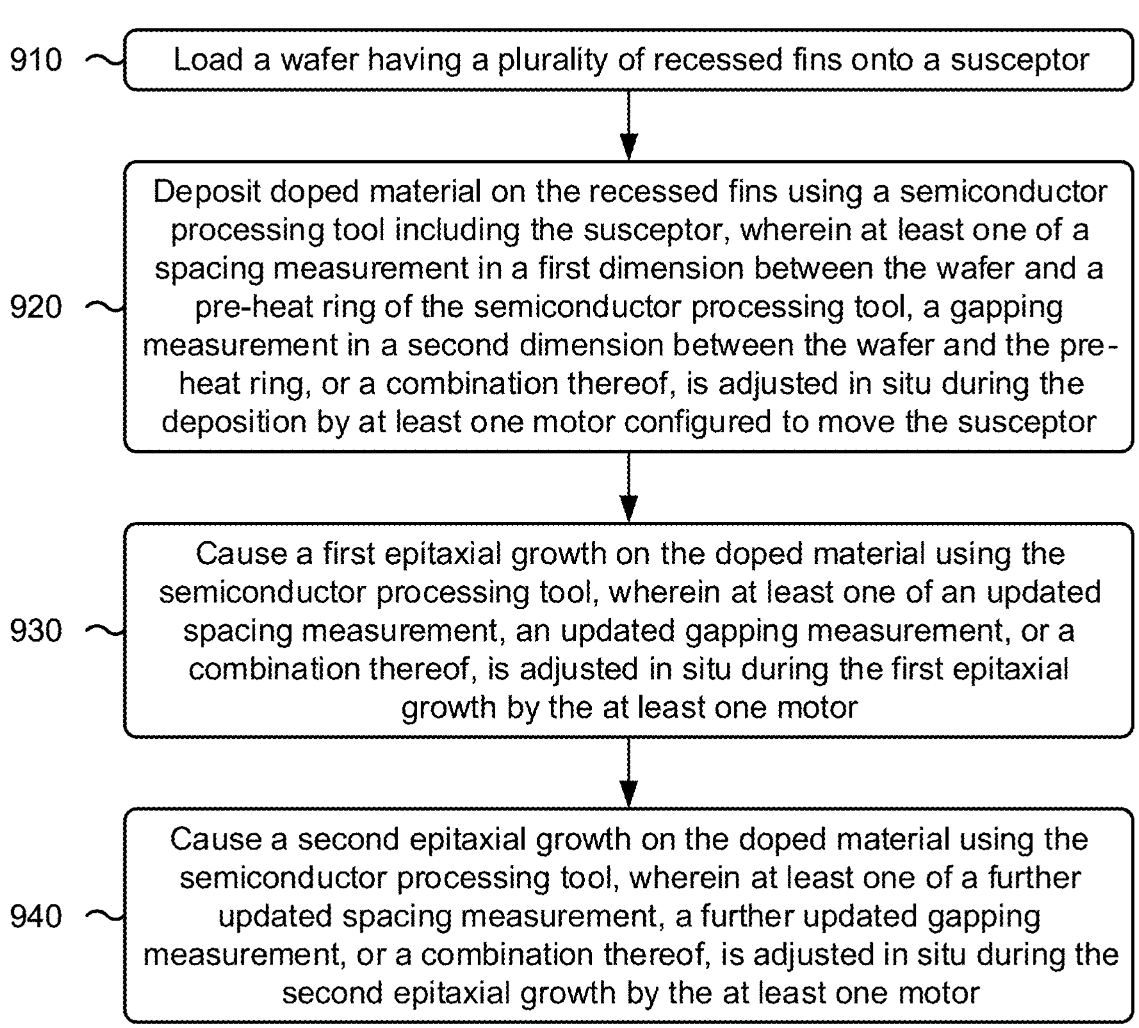

FIG. 9 is a flowchart of an example process 900 associated with dynamically adjusting a spacing and/or a gapping associated with a susceptor. In some implementations, one or more process blocks of FIG. 9 may be performed by a semiconductor processing tool (e.g., semiconductor processing tool 100). In some implementations, one or more process blocks of FIG. 9 may be performed by another device or a group of devices separate from or including the device, such as a controller (e.g., controller 505), an optical sensor (e.g., at least one optical sensor 501), a motor (e.g., motor 503*a*, motor 503*b*, and/or another motor), and/or a susceptor blade (e.g., blade 601). Additionally, or alternatively, one or more process blocks of FIG. 9 may be performed by one or more components of device 800, such as processor 820, memory 830, input component 840, output component 850, and/or communication component 860.

As shown in FIG. 9, process 900 may include loading a wafer having a plurality of recessed fins onto a susceptor (block 910). For example, the semiconductor processing tool 100 may load a wafer 103 having a plurality of recessed fins 707*a*/707*b* onto a susceptor 101, as described herein.

As further shown in FIG. 9, process 900 may include depositing doped material on the recessed fins using a semiconductor processing tool including the susceptor (block 920). For example, the semiconductor processing tool 100 may deposit doped material 709*a*/709*b* on the recessed fins 707*a*/707*b*, as described herein. In some implementations, at least one of a spacing measurement in a first dimension between the wafer 103 and a pre-heat ring 117*a*/117*b* of the semiconductor processing tool, a gapping measurement in a second dimension between the wafer 103 and the pre-heat ring 117*a*/117*b*, or a combination thereof, is adjusted in situ during the deposition by at least one motor 503*a*/503*b* configured to move the susceptor 101.

As further shown in FIG. 9, process 900 may include causing a first epitaxial growth on the doped material using the semiconductor processing tool (block 930). For example, the semiconductor processing tool 100 may cause a first epitaxial growth 711*a*/711*b* on the doped material 709*a*/709*b*, as described herein. In some implementations, at least one of an updated spacing measurement, an updated gapping measurement, or a combination thereof, is adjusted in situ during the first epitaxial growth by the at least one motor 503*a*/503*b*.

As further shown in FIG. 9, process 900 may include causing a second epitaxial growth on the doped material using the semiconductor processing tool (block 940). For example, the semiconductor processing tool 100 may cause a second epitaxial growth 713*a*/713*b* on the doped material 709*a*/709*b*, as described herein. In some implementations, at least one of a further updated spacing measurement, a further updated gapping measurement, or a combination thereof, is adjusted in situ during the second epitaxial growth by the at least one motor 503*a*/503*b*.

Process 900 may include additional implementations, such as any single implementation or any combination of implementations described below and/or in connection with one or more other processes described elsewhere herein.

In a first implementation, the second epitaxial growth causes formation of merged source/drain regions across at least two of the recessed fins 707*a*/707*b*.

In a second implementation, alone or in combination with the first implementation, process 900 further includes rotating the susceptor 101 during the deposition, the first epitaxial growth, and the second epitaxial growth.

In a third implementation, alone or in combination with one or more of the first and second implementations, a rotation speed associated with one of the deposition, the first epitaxial growth, or the second epitaxial growth is different from a rotation speed associated with another of the deposition, the first epitaxial growth, or the second epitaxial growth.

In a fourth implementation, alone or in combination with one or more of the first through third implementations, the at least one motor 503*a*/503*b* performs adjustments in situ based on input from at least one optical sensor 501.

In a fifth implementation, alone or in combination with one or more of the first through fourth implementations, process 900 further includes unloading the wafer 103 from the susceptor 101 after the second epitaxial growth.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, spacing and/or gapping, of a susceptor relative to a pre-heat ring, are dynamically adjusted. For example, the controller 505 uses the at least one optical sensor 501 to determine a gapping measurement and/or a spacing measurement. Accordingly, the controller 505 instructs the at least one motor 503*a*/503*b* to adjust the susceptor 101 based on the gapping measurement and/or the spacing measurement. As a result, the susceptor 101 is adjusted more quickly and accurately. Additionally, the susceptor 101 is adjusted without disturbing the vacuum within the susceptor environment, which decreases a chance of impurities entering the environment and spoiling deposition processes. Fewer spoiled deposition processes result in less production time that is lost and fewer materials that are wasted. Additionally, in some implementations, the controller 505 is programmed with a series of processing steps such the at least one motor 503*a*/503*b* performs adjustments between each processing step. Accordingly, an epitaxial structure may be formed successively without removing the wafer 103 from the susceptor between processing steps. As a result, production time is reduced. Additionally, the susceptor 101 is adjusted between processing steps without disturbing the vacuum, which decreases a chance of impurities entering the environment and spoiling later deposition processes, and without moving the wafer 103, which decreases a chance of the wafer 103 being scratched or otherwise damaged during movement. Fewer spoiled deposition processes and fewer damaged wafers result in less production time that is lost and fewer materials that are wasted.

As described in greater detail above, some implementations described herein provide a device. The device includes at least one motor configured to move a susceptor of a semiconductor processing tool, wherein the at least one motor is configured to move the susceptor vertically, laterally, or a combination thereof in situ during a process according to a command. The device includes a controller configured to receive input during the process associated with a spacing measurement in a first dimension between a wafer on the susceptor and a pre-heat ring, a gapping measurement in a second dimension between the wafer and the pre-heat ring, or a combination thereof, and configured to provide the command to the at least one motor based on the input.

As described in greater detail above, some implementations described herein provide a method. The method includes determining at least one of a spacing measurement in a first dimension between a susceptor and a pre-heat ring of a semiconductor processing tool, a gapping measurement in a second dimension between the susceptor and the pre-heat ring, or a combination thereof, using one or more images captured by at least one optical sensor. The method includes generating a command based on a setting associated with a processing step being performed by the semiconductor processing tool and the spacing measurement, the gapping measurement, or the combination thereof. The method includes providing the command to at least one motor to move a column supporting the susceptor.

As described in greater detail above, some implementations described herein provide a method. The method includes loading a wafer having a plurality of recessed fins onto a susceptor. The method further includes depositing doped material on the recessed fins using a semiconductor processing tool including the susceptor, wherein at least one of a spacing measurement in a first dimension between the wafer and a pre-heat ring of the semiconductor processing tool, a gapping measurement in a second dimension between the wafer and the pre-heat ring, or a combination thereof, is adjusted in situ during the deposition by at least one motor configured to move the susceptor. The method includes causing a first epitaxial growth on the doped material using the semiconductor processing tool, wherein at least one of an updated spacing measurement, an updated gapping measurement, or a combination thereof, is adjusted in situ during the first epitaxial growth by the at least one motor. The method further includes causing a second epitaxial growth on the doped material using the semiconductor processing tool, wherein at least one of a further updated spacing measurement, a further updated gapping measurement, or a combination thereof, is adjusted in situ during the second epitaxial growth by the at least one motor.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

loading a wafer onto a susceptor;

depositing doped material on the wafer using a semiconductor processing tool including the susceptor, wherein at least one of a spacing measurement in a first dimension between the wafer and a pre-heat ring of the semiconductor processing tool, a gapping measurement in a second dimension between the wafer and the pre-heat ring, or a combination thereof, is adjusted in situ during the deposition by at least one motor configured to move the susceptor;

causing a first epitaxial growth on the doped material using the semiconductor processing tool, wherein at least one of an updated spacing measurement, an updated gapping measurement, or a combination thereof, is adjusted in situ during the first epitaxial growth by the at least one motor; and causing a second epitaxial growth on the doped material using the semiconductor processing tool, wherein at least one of a further updated spacing measurement, a further updated gapping measurement, or a combination thereof, is adjusted in situ during the second epitaxial growth by the at least one motor.

2. The method of claim 1, wherein the second epitaxial growth causes formation of merged source/drain regions across at least two recessed fins of the wafer.

3. The method of claim 1, wherein the at least one motor performs adjustments in situ based on input from at least one optical sensor.

4. The method of claim 1, further comprising:

unloading the wafer from the susceptor after the second epitaxial growth.

5. The method of claim 1, wherein the at least one motor comprises a rotational motor associated with rotation of the susceptor.

6. The method of claim 1, further comprising:

rotating the susceptor during the deposition, the first epitaxial growth, and the second epitaxial growth.

7. The method of claim 6, wherein a rotation speed associated with one of the deposition, the first epitaxial growth, or the second epitaxial growth is different from a rotation speed associated with another of the deposition, the first epitaxial growth, or the second epitaxial growth.

8. A method, comprising:

loading a wafer onto a susceptor;

depositing doped material on the wafer, wherein a spacing measurement in a first dimension between the wafer and a pre- heat ring and a gapping measurement in a second dimension between the wafer and the pre-heat ring are adjusted during the deposition by a plurality of motors configured to move the susceptor;

causing a first epitaxial growth on the doped material, wherein an updated spacing measurement and an updated gapping measurement, are adjusted during the first epitaxial growth by the plurality of motors; and causing a second epitaxial growth on the doped material, wherein a further updated spacing measurement and a further updated gapping measurement are adjusted during the second epitaxial growth by the plurality of motors.

9. The method of claim 8, wherein the second epitaxial growth causes formation of merged source/drain regions across at least two recessed fins of the wafer.

10. The method of claim 8, wherein the plurality of motors performs adjustments based on input from at least one optical sensor.

11. The method of claim 8, further comprising:

unloading the wafer from the susceptor after the second epitaxial growth.

12. The method of claim 8, wherein at least one motor of the plurality of motors comprises a rotational motor associated with rotation of the susceptor.

13. The method of claim 8, further comprising:

rotating the susceptor during the deposition, the first epitaxial growth, and the second epitaxial growth.

14. The method of claim 13, wherein a rotation speed associated with one of the deposition, the first epitaxial growth, or the second epitaxial growth is different from a rotation speed associated with another of the deposition, the first epitaxial growth, or the second epitaxial growth.

15. The method of claim 8, wherein a first motor of the plurality of motors comprises a first shaft connected to a column disposed under the susceptor, and wherein a second motor of the plurality of motors comprises a second shaft connected to the column.

16. The method of claim 15, wherein the first motor is configured to move the column via the first shaft along a first direction to adjust at least one of the gapping measurement or the spacing measurement between the wafer and the pre-heat ring, and wherein the second motor is configured to move the column via the second shaft along a second direction to adjust at least one of the gapping measurement or the spacing measurement between the wafer and the pre-heat ring.

17. A method, comprising:

depositing doped material on a wafer using a semiconductor processing tool including a susceptor, wherein the wafer is on the susceptor, and wherein at least one of a spacing measurement in a first dimension between the wafer and a pre-heat ring of the semiconductor processing tool or a gapping measurement in a second dimension between the wafer and the pre-heat ring is adjusted in situ during the deposition by at least one motor configured to move the susceptor;

causing a first epitaxial growth on the doped material using the semiconductor processing tool, wherein at least one of an updated spacing measurement or an updated gapping measurement is adjusted in situ during the first epitaxial growth by the at least one motor; and causing a second epitaxial growth on the doped material using the semiconductor processing tool, wherein at least one of a further updated spacing measurement or a further updated gapping measurement is adjusted in situ during the second epitaxial growth by the at least one motor.

18. The method of claim 17, wherein the second epitaxial growth causes formation of merged source/drain regions across at least two fins.

19. The method of claim 17, further comprising:

rotating the susceptor during at least one of the deposition, the first epitaxial growth, or the second epitaxial growth.

20. The method of claim 17, wherein the at least one motor comprises a shaft connected to a column disposed under the susceptor, and wherein the at least one motor is configured to move the column via the shaft along a direction to adjust at least one of the gapping measurement or the spacing measurement between the wafer and the pre-heat ring.

* * * * *